United States Patent
Zhang et al.

(10) Patent No.: US 9,240,375 B2
(45) Date of Patent: Jan. 19, 2016

(54) MODULAR FUSES AND ANTIFUSES FOR INTEGRATED CIRCUITS

(71) Applicants: STMicroelectronics, Inc., Coppell, TX (US); International Business Machines Corporation, Armonk, NY (US)

(72) Inventors: John H. Zhang, Fishkill, NY (US); Lawrence A. Clevenger, LaGrangeville, NY (US); Carl Radens, LaGrangeville, NY (US); Yiheng Xu, Hopewell Junction, NY (US); Edem Wornyo, Danbury, CT (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 20 days.

(21) Appl. No.: 13/931,692

(22) Filed: Jun. 28, 2013

(65) Prior Publication Data
US 2015/0002213 A1 Jan. 1, 2015

(51) Int. Cl.
H03H 11/40 (2006.01)
H01L 23/525 (2006.01)
H01F 17/02 (2006.01)
H01L 23/522 (2006.01)
H01L 49/02 (2006.01)

(52) U.S. Cl.
CPC ............ *H01L 23/5252* (2013.01); *H01F 17/02* (2013.01); *H01L 23/522* (2013.01); *H01L 23/5227* (2013.01); *H01L 23/5256* (2013.01); *H01L 28/10* (2013.01); *H01L 28/20* (2013.01); *H01L 2924/0002* (2013.01)

(58) Field of Classification Search
None
See application file for complete search history.

(56) References Cited

U.S. PATENT DOCUMENTS 8,466,560 B2 6/2013 Zhang et al.
2010/0330722 A1* 12/2010 Hsieh et al. .................... 438/53

* cited by examiner

*Primary Examiner* — Cassandra Cox
(74) *Attorney, Agent, or Firm* — Seed IP Law Group PLLC

(57) ABSTRACT

Nanoscale efuses, antifuses, and planar coil inductors are disclosed. A copper damascene process can be used to make all of these circuit elements. A low-temperature copper etch process can be used to make the efuses and efuse-like inductors. The circuit elements can be designed and constructed in a modular fashion by linking a matrix of metal columns in different configurations and sizes. The number of metal columns, or the size of a dielectric mesh included in the circuit element, determines its electrical characteristics. Alternatively, the efuses and inductors can be formed from interstitial metal that is either deposited into a matrix of dielectric columns, or left behind after etching columnar openings in a block of metal. Arrays of metal columns also serve a second function as features that can improve polish uniformity in place of conventional dummy structures. Use of such modular arrays provides flexibility to integrated circuit designers.

11 Claims, 20 Drawing Sheets

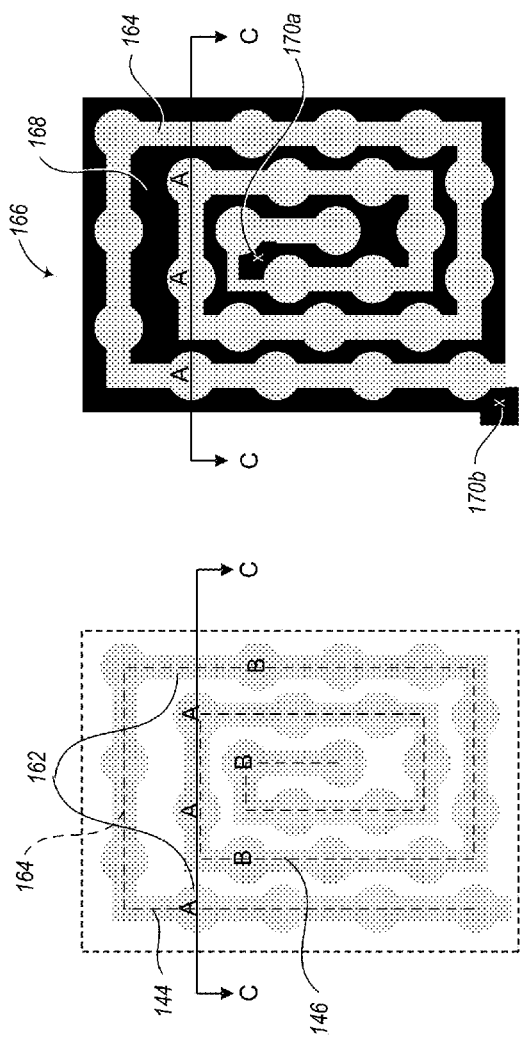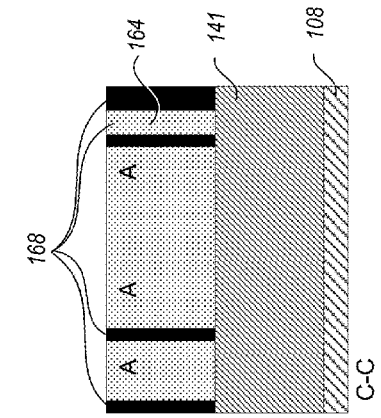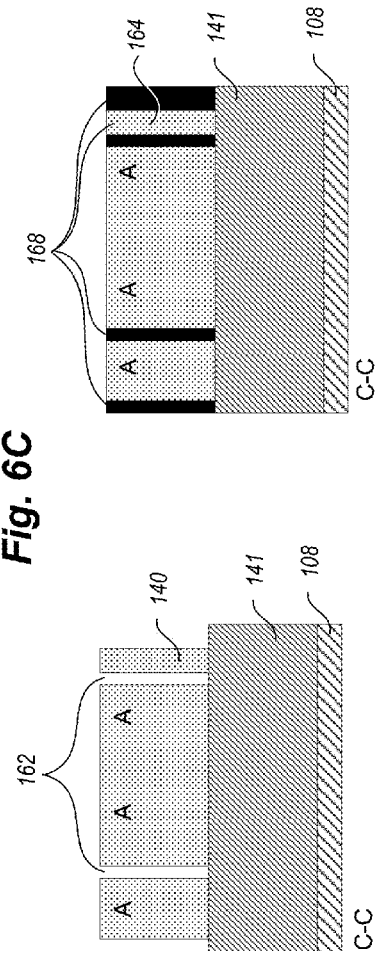

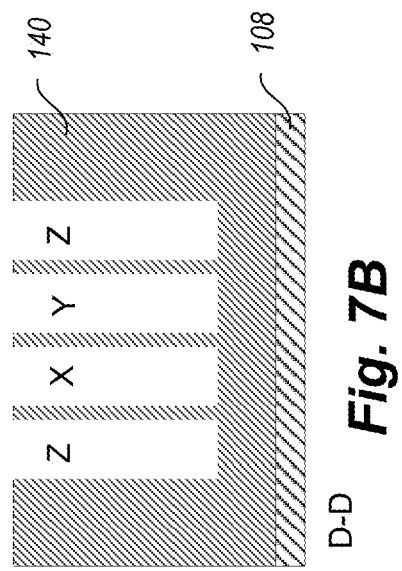
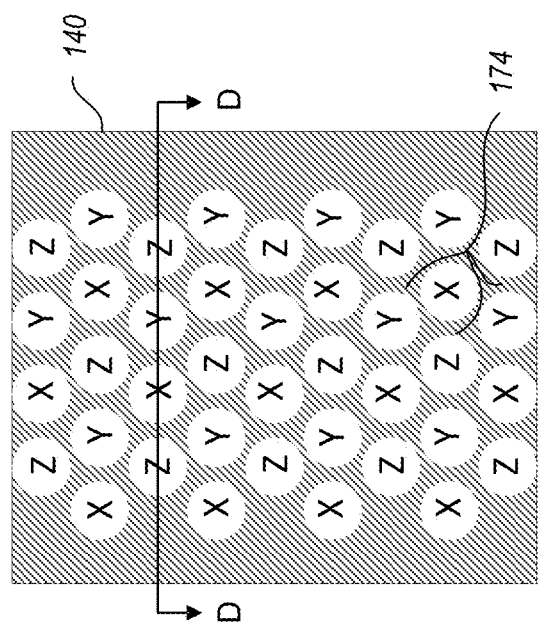
Fig. 7B
Fig. 7A

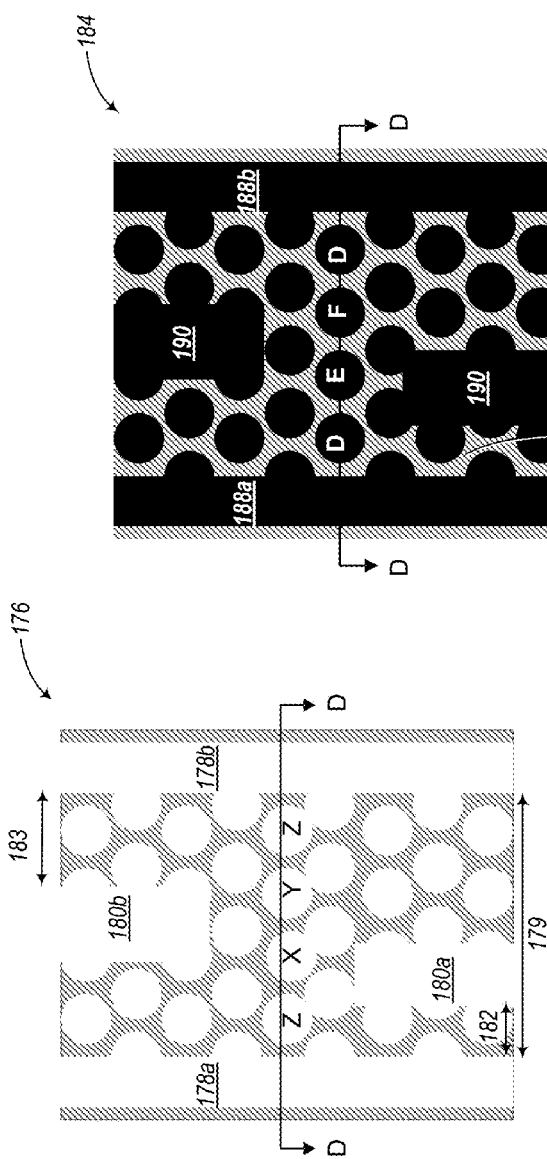
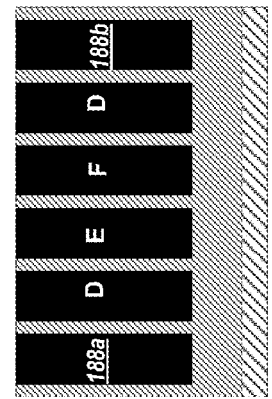
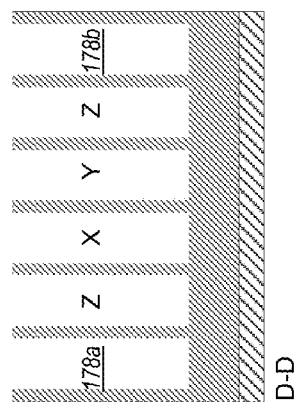
Fig. 8A
Fig. 8B
Fig. 8C
Fig. 8D

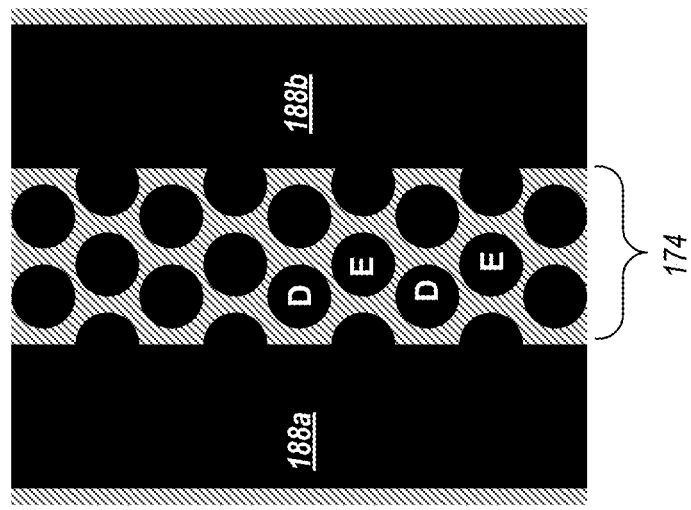
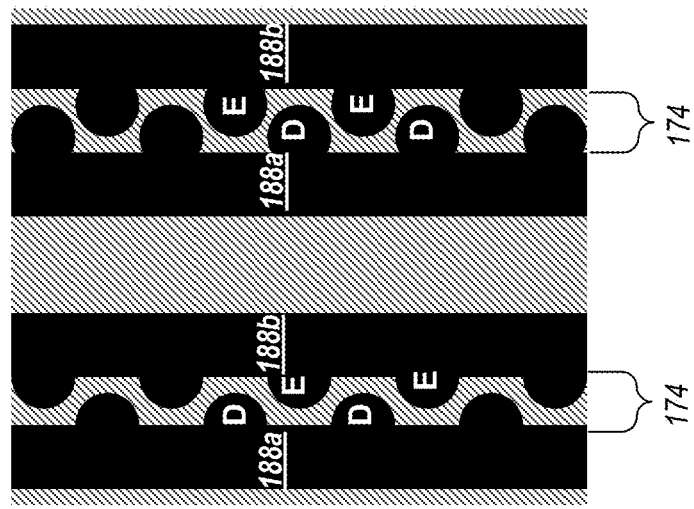

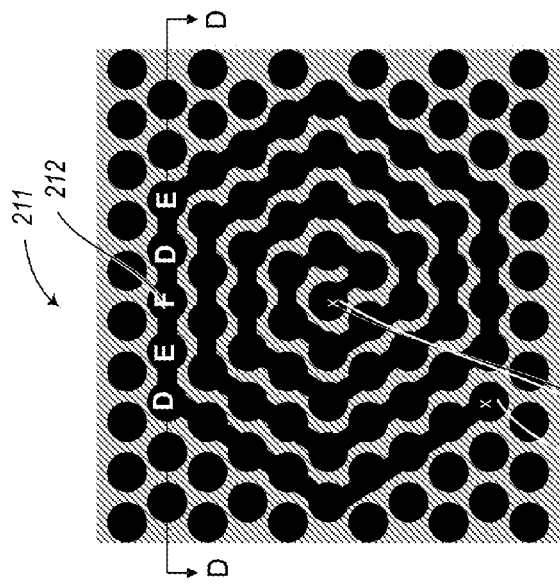
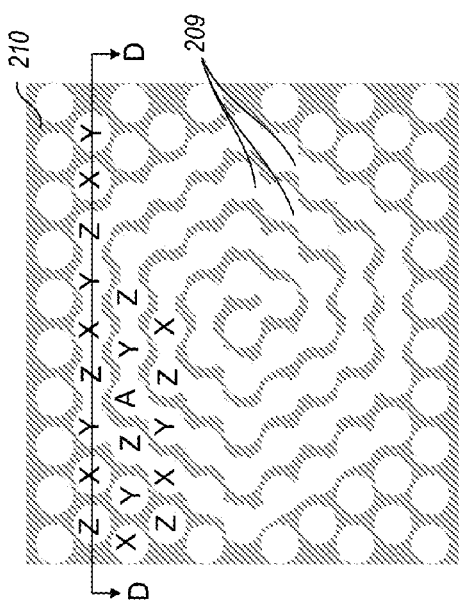
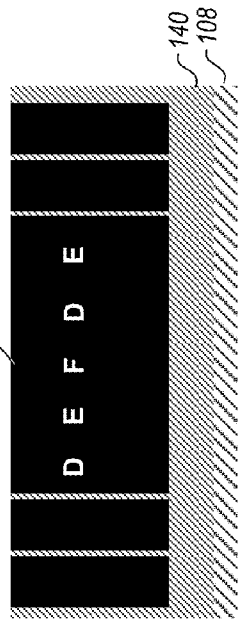
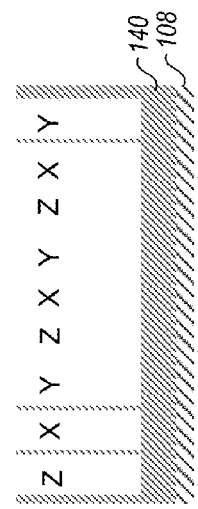
Fig. 12A
Fig. 12B
Fig. 12C
Fig. 12D

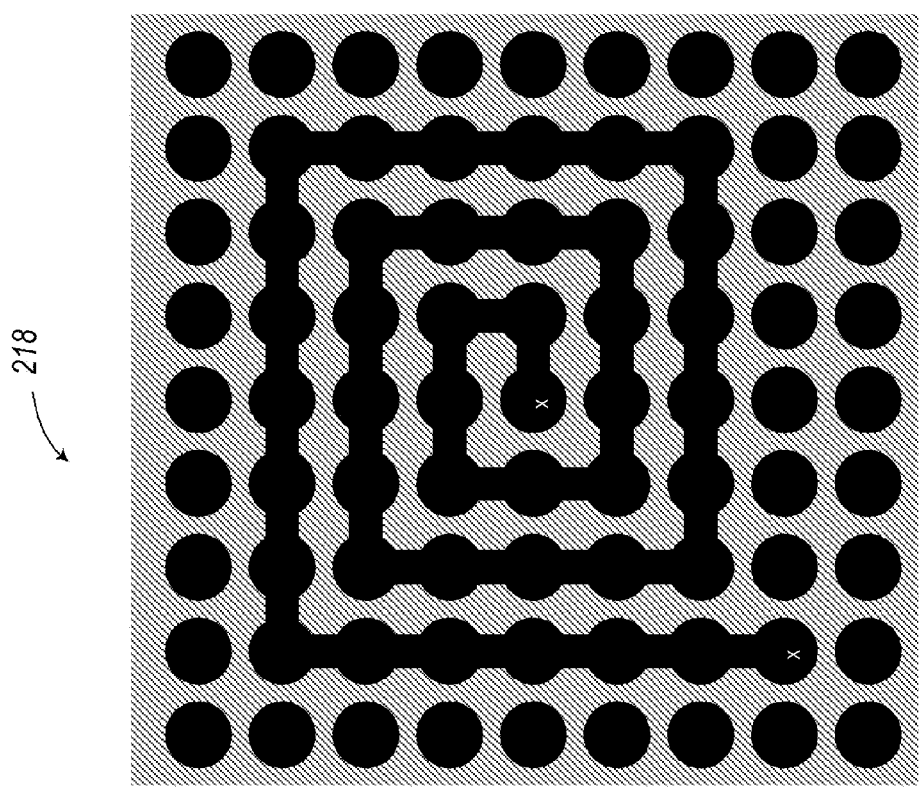

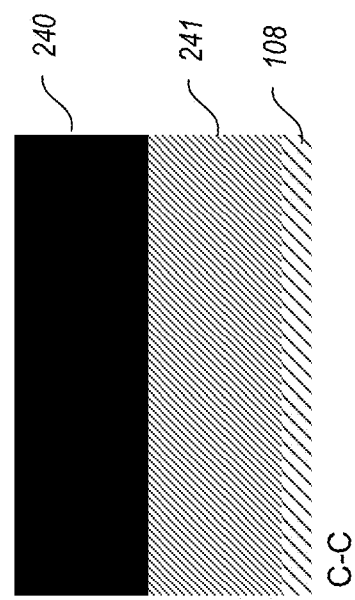
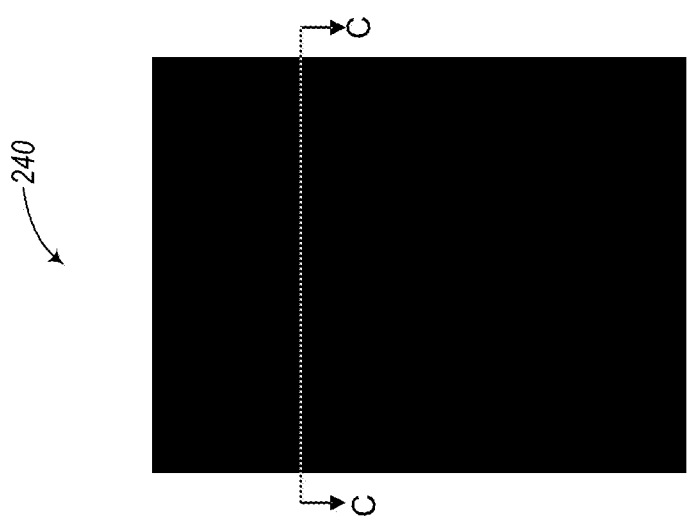
Fig. 15B
Fig. 15A

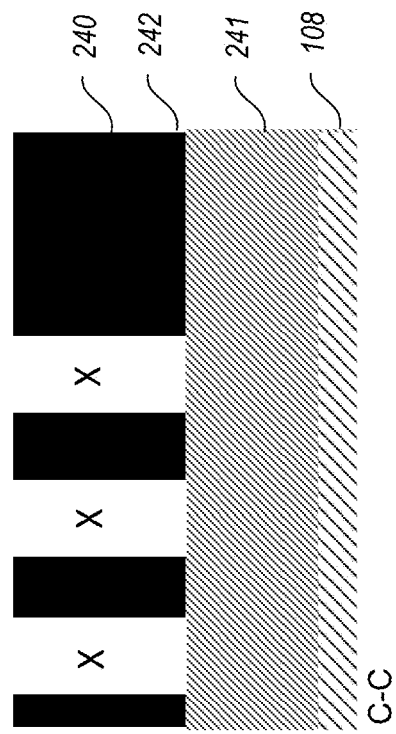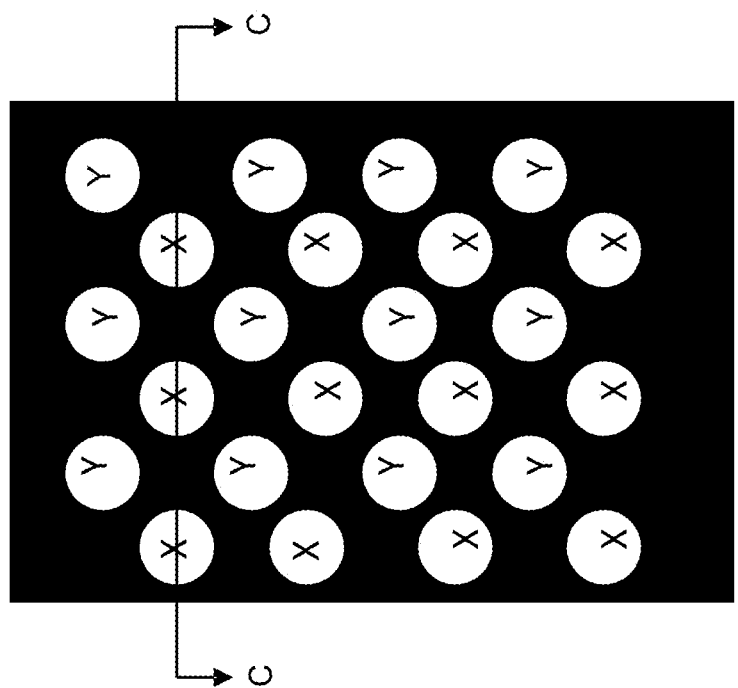
Fig. 16B
Fig. 16A

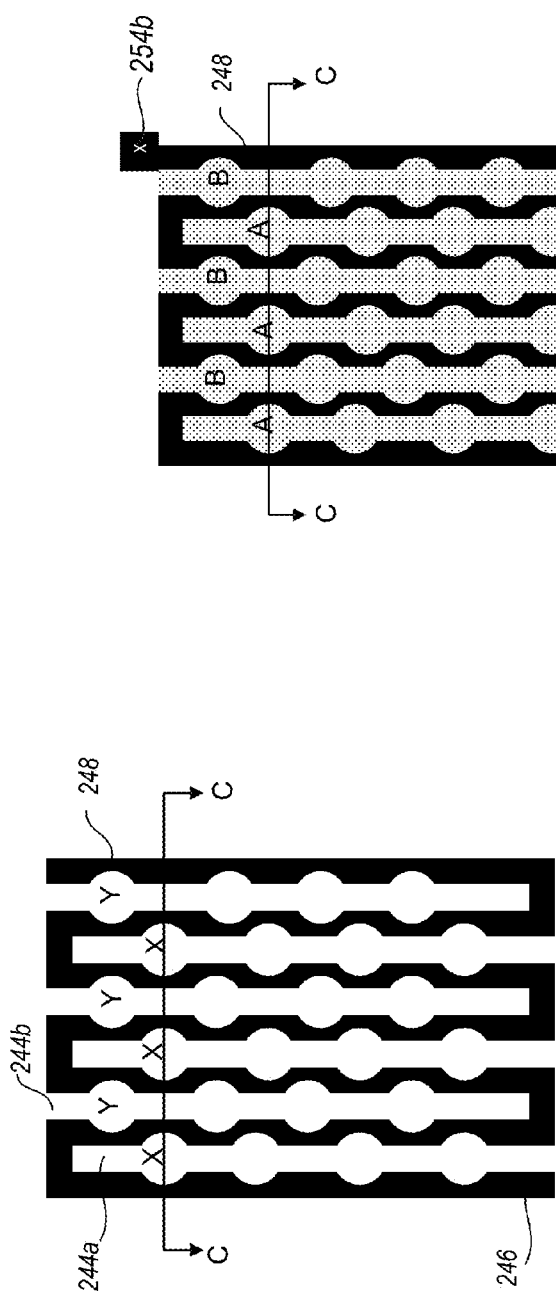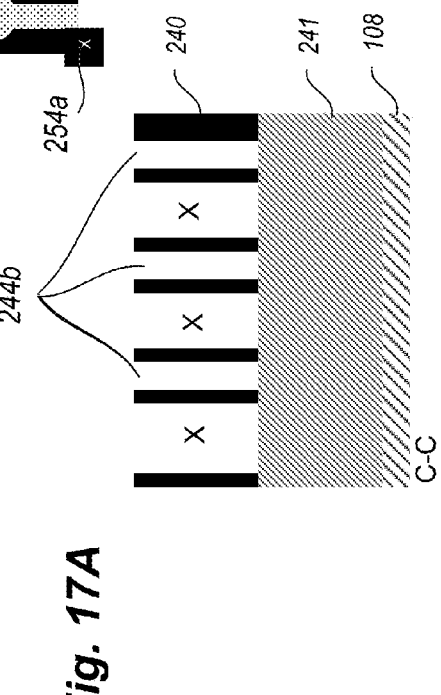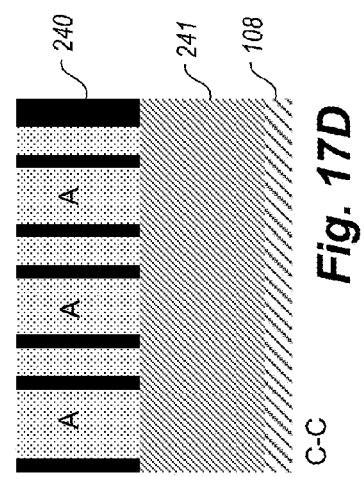
Fig. 17A
Fig. 17B
Fig. 17C
Fig. 17D

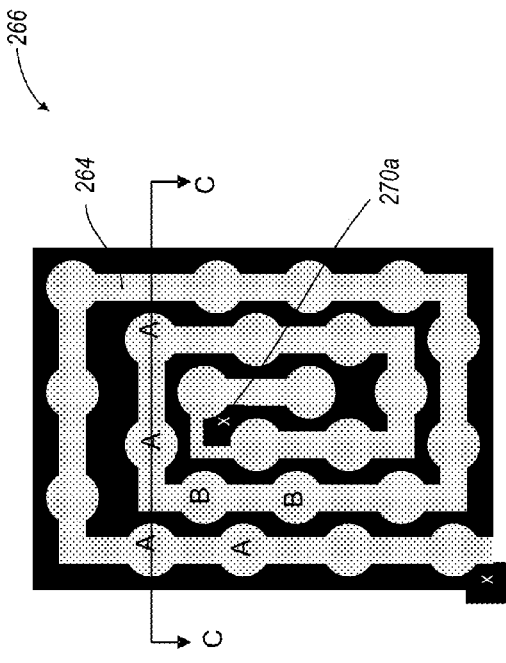
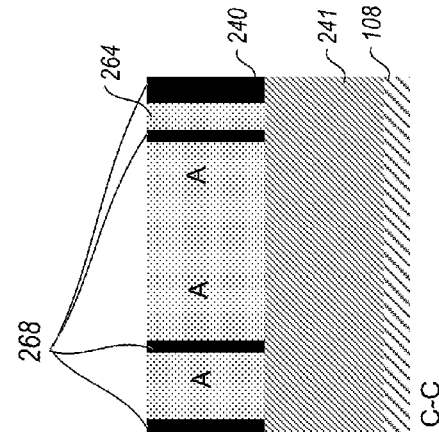
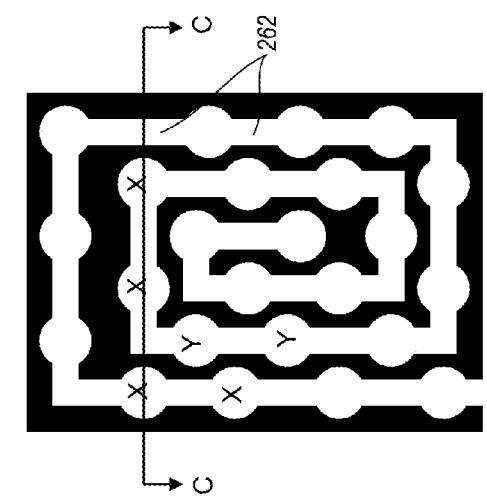
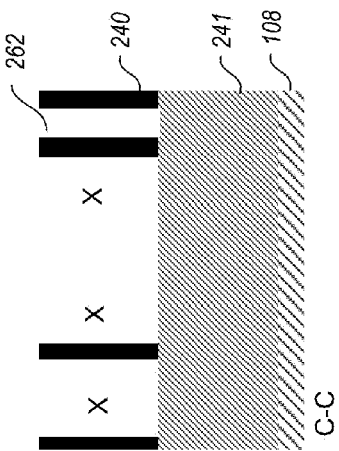

MODULAR FUSES AND ANTIFUSES FOR INTEGRATED CIRCUITS

BACKGROUND

1. Technical Field

The present disclosure relates to the fabrication of modular fuses and antifuses for use in integrated circuits. Electrically operable fuses and antifuses are used for such purposes as altering circuit connections, and replacing defective circuit elements with redundant circuit elements.

2. Description of the Related Art

A fuse is a sacrificial device that is designed to protect one or more circuit elements from excess electric current. The fuse can be coupled in series with one or more the circuit elements so that an excess level of current will trip the fuse, sometimes by melting, burning or exploding, and therefore interrupt the circuit before the neighboring circuit element is damaged.

An antifuse is sacrificial device that is designed to protect one or more circuit elements from excess electric voltage. The antifuse includes two conductors and an intervening dielectric which is subject to breakdown upon application of an excess voltage between the conductors. The antifuse can be coupled in parallel with one or more the circuit elements so that an excess voltage level will break down the dielectric, causing a short circuit through the antifuse. The short circuit directs current flow away from the parallel circuit element, thereby preventing damage.

Microelectronic fuses (efuses) and antifuses are utilized within the field of integrated circuits and semiconductor processing for a number of purposes. For example, an array of efuses or antifuses can be programmably coupled to certain circuit elements to alter microelectronic circuits. Or, failed circuit elements can be replaced by redundant circuit elements, using efuses and/or antifuses.

Chemical mechanical planarization (CMP) is a polishing technique used in the semiconductor industry to planarize (make flat) the surface of a semiconductor wafer at various times during an integrated circuit fabrication process. Typically, it is desirable to planarize the wafer surface after completing deposition and patterning of a layer, before proceeding to deposit a next layer of material. If planarization is omitted, the topography of the un-planarized surface can be transferred to, or accentuated in, subsequent layers. Such topography effects are more likely to occur if materials used in subsequent layers have poor ability to fill surface recesses.

A CMP process typically entails polishing the wafer surface using a rotating pad and a slurry made from various chemicals and abrasive particulates, so that both chemical and physical removal mechanisms contribute to the planarization. Depending on the materials and the circuit features being polished, the CMP process may gouge the surface, causing CMP-induced topography and thereby degrading the surface uniformity. Such gouging of the surface is sometimes referred to as "dishing." If local erosion is too great, the CMP process used during subsequent layers may not effectively remove material (e.g., metal) from recessed areas. Puddle defects in which residual metal is left behind in the recessed areas can cause short circuits.

When polishing metal features, dishing tends to occur disproportionally where the surface has large fields of metal as opposed to arrays of smaller metal features. Such large fields of metal are more numerous at higher metal layers which are farther away from the active transistor devices, where the metal interconnect structure is less dense and the metal lines can be made larger. It is customary to break up such large metal features by patterning arrays of small scale dummy metal features that do not participate in microelectronic circuits, but are only used to improve uniformity of the CMP process. The use of dummy structures consumes valuable real estate on an integrated circuit chip that could otherwise be used to accommodate active electronic devices. Therefore, alternatives to the use of such dummy structures are of great interest to integrated circuit manufacturers.

BRIEF SUMMARY

Sacrificial microelectronic circuit elements, including resistors for use as efuses, and vertically oriented parallel plate capacitors for use as antifuses, are disclosed. In addition, several different geometries of planar coil inductors are disclosed. A low-temperature copper patterning process can be used to make the efuses and efuse-like inductors. A damascene fabrication process can be used to make the efuses, antifuses, and the inductors.

Such circuit elements can be designed and constructed in a modular fashion by linking metal columns, selected from an array of columns, in different configurations and sizes. For example, adjacent metal columns can be linked in a serpentine pattern to form resistors for use as efuses. Alternatively, adjacent metal columns can be linked in a hexagonal or a square coil to form an inductor. A dielectric mesh network flanked by a pair of electrodes forms a modular capacitive antifuse. The number of metal columns, or the size of a dielectric mesh included in the circuit element, determines the electrical characteristics of the circuit element. For example, the resistance of a serpentine resistor depends on its length, which can be adjusted by linking more or fewer metal columns. Likewise, the breakdown voltage of a capacitor depends on the size of the dielectric mesh network encompassed by the electrodes.

Alternatively, the serpentine resistors (efuses) and coils (inductors) can be formed either from interstitial metal deposited into a matrix of dielectric columns, or from interstitial metal left behind after etching columnar openings in a block of metal.

In addition to their function as fuses and antifuses, the surface patterns of such metal arrays also serve a second function as features that can improve CMP uniformity in place of conventional dummy structures. The modular aspect of the arrays provides great flexibility to integrated circuit designers, both with regard to their fuse/antifuse function and their CMP uniformity function.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 6A is a top plan view of a patterned dielectric matrix for an efuse-like inductor, according to one embodiment described herein.

FIG. 6B is a cross-sectional view of the patterned dielectric matrix shown in FIG. 6A.

FIG. 6C is a top plan view of an interstitial metal coil for use as an efuse-like inductor.

FIG. 6D is a cross-sectional view of the interstitial metal coil shown in FIG. 6C.

FIG. 7A is a top plan view of a patterned dielectric matrix for an antifuse, according to one embodiment described herein.

FIG. 7B a cross-sectional view of the patterned dielectric matrix shown in FIG. 7A.

FIG. 8A is a top plan view of a further patterned dielectric for an antifuse, including electrode trenches, according to one embodiment.

FIG. 8B is a cross-sectional view of the patterned dielectric shown in FIG. 8A.

FIG. 8C is a top plan view of a parallel plate capacitor for use as an antifuse, according to a first embodiment.

FIG. 8D is a cross-sectional view of the parallel plate capacitor shown in FIG. 8C.

FIG. 9A is a top plan view of a parallel plate capacitor for use as an antifuse, according to a second embodiment.

FIG. 9B is a cross-sectional view of the parallel plate capacitor shown in FIG. 9A.

FIG. 12A is a top plan view of a patterned dielectric matrix for a hexagonal antifuse-like inductor, according to one embodiment described herein.

FIG. 12B is a cross-sectional view of the patterned dielectric matrix shown in FIG. 12A.

FIG. 12C is a top plan view of a hexagonal antifuse-like inductor, according to one embodiment described herein.

FIG. 12D is a cross-sectional view of the hexagonal antifuse-like inductor shown in FIG. 12C.

FIG. 13 is a top plan view of a square antifuse-like inductor, according to one embodiment described herein.

FIG. 15A is a top plan view of a metal block.

FIG. 15B is a cross-sectional view of the metal block shown in FIG. 15A.

FIG. 16A is a top plan view of a patterned matrix of openings formed in the metal block shown in FIG. 15A.

FIG. 16B is a cross-sectional view of the patterned matrix shown in FIG. 16A.

FIG. 17A is a top plan view of a metal serpentine resistor formed by etching the metal block shown in FIG. 16A.

FIG. 17B is a cross-sectional view of the metal serpentine resistor shown in FIG. 17A.

FIG. 17C is a top plan view of a metal serpentine resistor for use as an efuse.

FIG. 17D is a cross-sectional view of the metal serpentine resistor shown in FIG. 17C.

FIG. 19A is a top plan view of a square metal coil according to one embodiment described herein.

FIG. 19B is a cross-sectional view of the square metal coil shown in FIG. 19A.

FIG. 19C is a top plan view of the square metal coil shown in FIG. 19A following deposition of a dielectric to form an efuse-like inductor.

FIG. 19D is a cross-sectional view of the efuse-like inductor shown in FIG. 19C.

DETAILED DESCRIPTION

Figure 1:
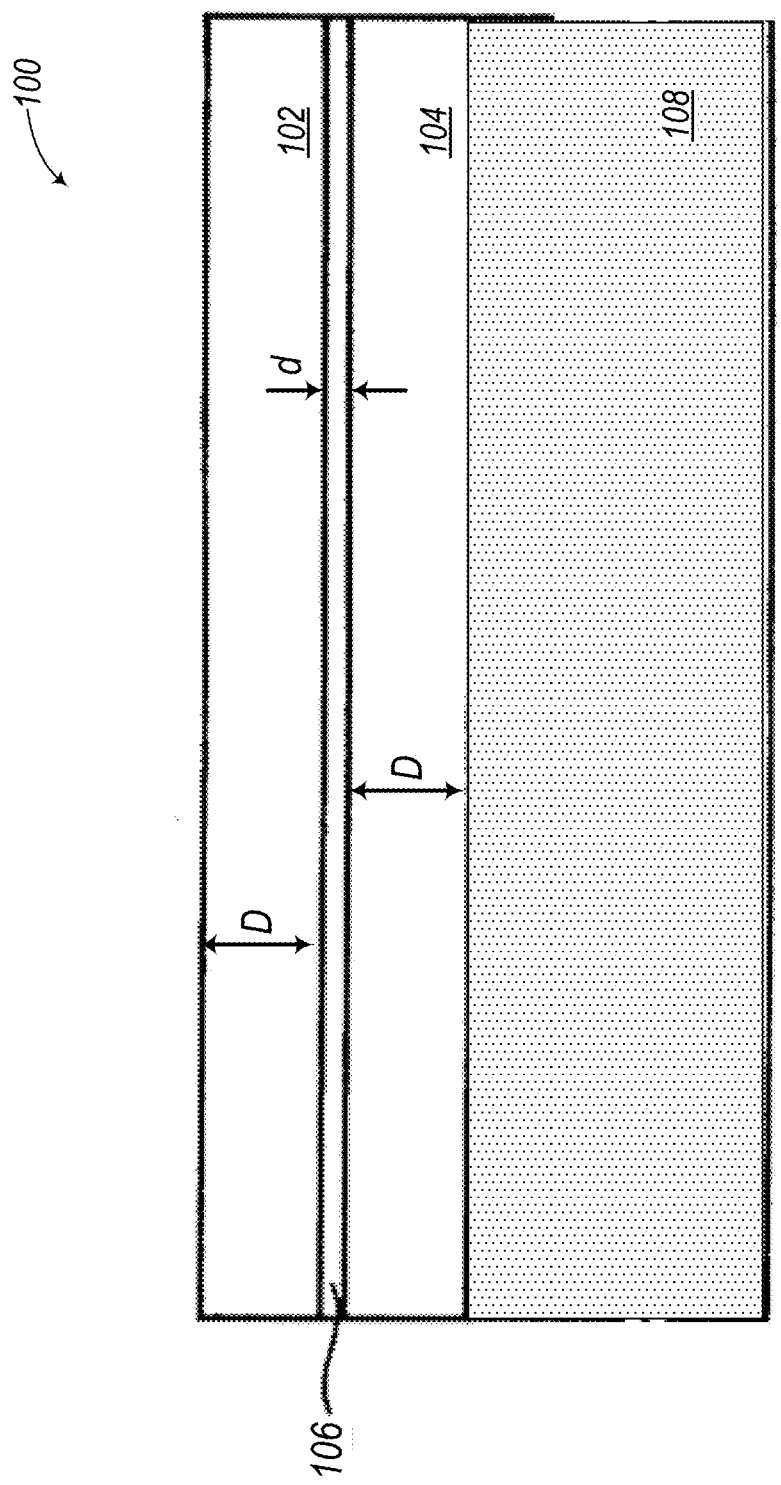
FIG. 1 is a cross-sectional view of a prior art antifuse in a horizontal orientation.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to arrays of metal structures that have been produced; however, the present disclosure and the reference to certain materials, dimensions, and the details and ordering of processing steps are exemplary and should not be limited to those shown. The terms "planarize" and "polish" are used synonymously throughout the specification.

In the figures, identical reference numbers identify similar features or elements. The sizes and relative positions of the features in the figures are not necessarily drawn to scale.

FIG. 1 shows a conventional integrated circuit capacitor 100 that serves as an antifuse for microelectronic circuits, according to the prior art. The conventional integrated circuit capacitor 100 is a parallel plate capacitor having a top metal electrode 102 and a bottom metal electrode 104, separated by a thin dielectric film 106. The conventional integrated circuit capacitor 100 is formed in a horizontal orientation on a substrate 108 (e.g., a silicon substrate). The thin dielectric film 106 has a thickness d that is desirably much smaller than a thickness D of the electrodes 102 and 104. The thickness d and the dielectric film material, characterized by a dielectric constant K, can be selected by a designer so that breakdown of the thin dielectric film 106 occurs at a smaller applied voltage than that which would damage a component wired in parallel to the capacitor 100.

Figure 2A:
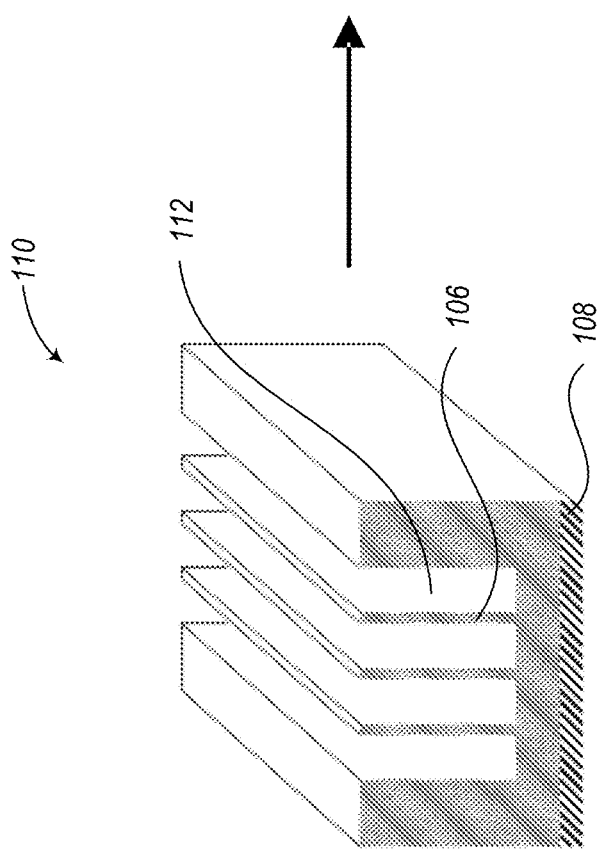
FIG. 2A is a cross-sectional view of a prior art antifuse in a vertical orientation.
Figure 2B:
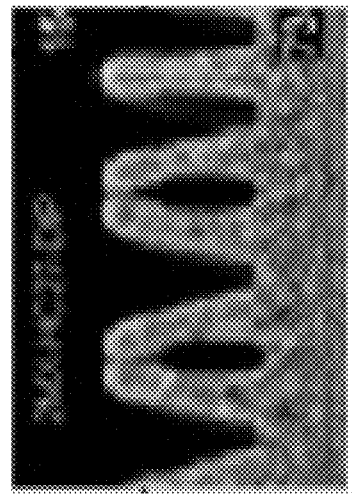
FIG. 2B is a cross-sectional scanning electron micrograph (SEM) of the prior art antifuse shown in FIG. 2A, showing collapsed dielectric structures.

FIG. 2A shows a partially formed damascene array 110 of integrated circuit parallel plate capacitor dielectric films 106 formed in a vertical orientation on the substrate 108. One advantage of such a vertical orientation is that it consumes significantly less real estate on the substrate 108 than does the horizontal orientation shown in FIG. 1. In one embodiment, the substrate 108 may be capped with a blocking layer of silicon carbide nitride ($SiC_xN_y$). A damascene array is formed by removing dielectric material from a dielectric block, and filling the spaces 112 with metal to form the electrodes 102. Very thin dielectric films 106 that will break down at a low voltage are needed to protect low power microelectronic devices. However, when the dielectric films 106 are made very thin, the partially formed damascene array 110 may not be structurally stable, and the parallel dielectric films 106 have a tendency to collapse, as shown in FIG. 2B.

Figure 3:
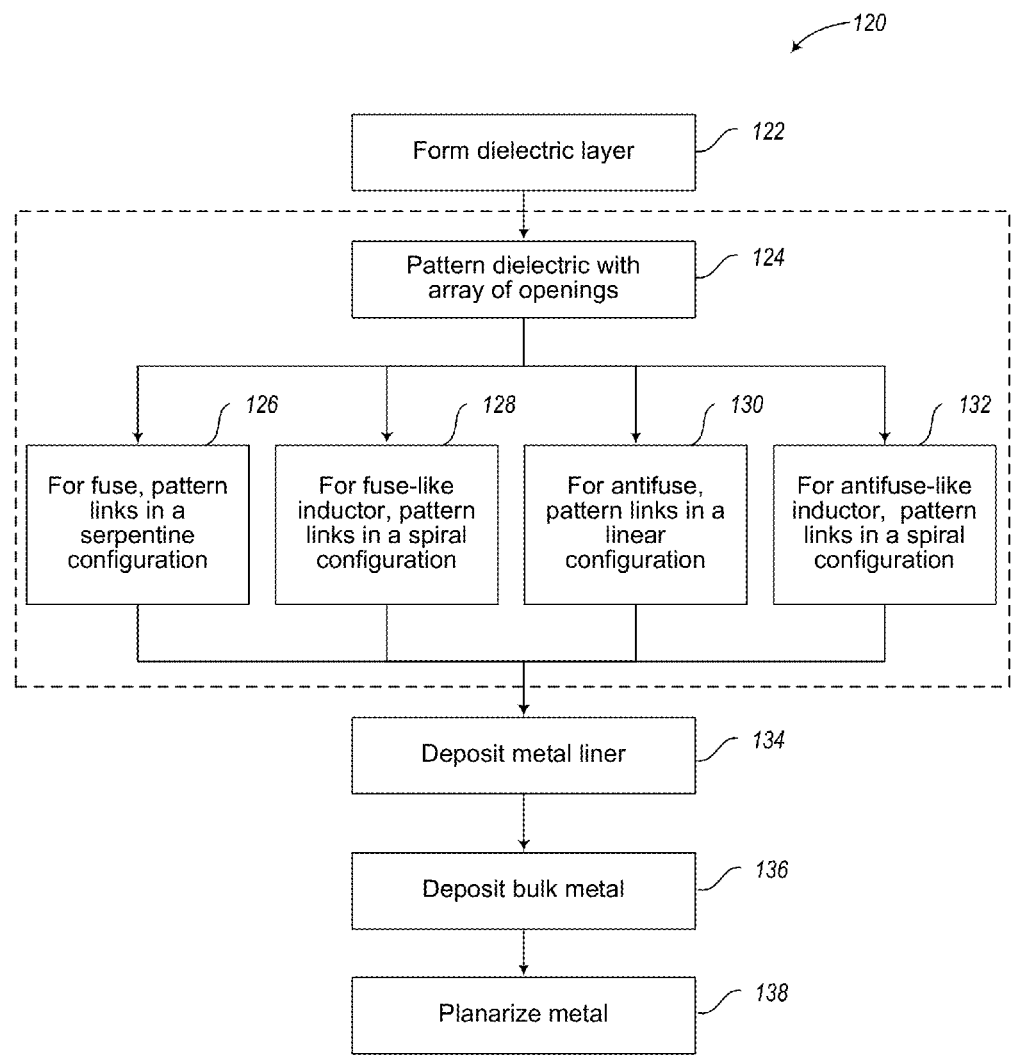
FIG. 3 is a high-level flow diagram describing a damascene fabrication process that can be used to create microelectronic efuses, antifuses, efuse-like inductors, and antifuse-like inductors, according to various embodiments as taught herein.

FIG. 3 shows a high level flow diagram of a sequence of steps in a damascene process 120 that can be used to form a vertical microelectronic antifuse that is structurally stable throughout the damascene process 120 according to various inventive embodiments. The damascene process 120 can also be used to form resistors for use as efuses. Furthermore, the damascene process 120 can also be used to form two different types of inductors, an antifuse-like inductor and an efuse-like inductor.

At 122, a dielectric layer is formed on a substrate.

At 124, the dielectric layer is patterned with an array of openings.

At 126-130, the dielectric layer is further patterned with three-dimensional links in different configurations depending on what type of circuit element (fuse, antifuse, or inductor) is desired. For a fuse (126), the links form a series of planes; for an inductor (128), the links form a planar spiral coil; for an antifuse (130), the links form a pair of substantially parallel planes.

At 132, a metal liner is deposited into the array of openings and into the links.

At 134, the array of openings and the links are filled with a bulk metal.

At 136, the bulk metal is planarized.

FIGS. 4-13 illustrate in further detail the formation of circuit elements according to the damascene process 120. A damascene process is typically used to form a metal interconnect structure (i.e., metal wires embedded in a dielectric material) when the metal is difficult to etch, for example, copper. A damascene process produces an inlaid metal structure by opening trenches in the dielectric block and filling the trenches with metal, for example, by plating or CVD. In this way, the inlaid metal structure is formed without etching the metal.

Figure 4B:
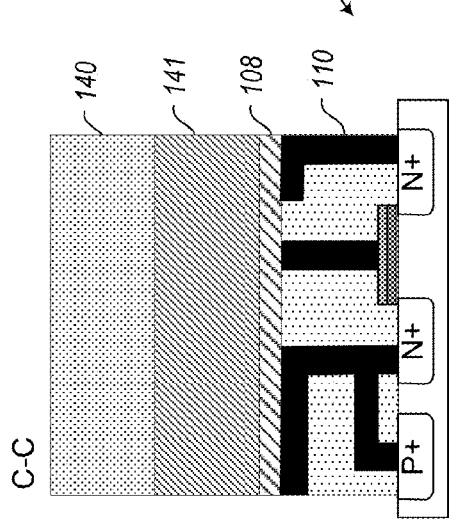
FIG. 4B is a cross-sectional view of the dielectric layer shown in FIG. 4A.
Figure 4C:
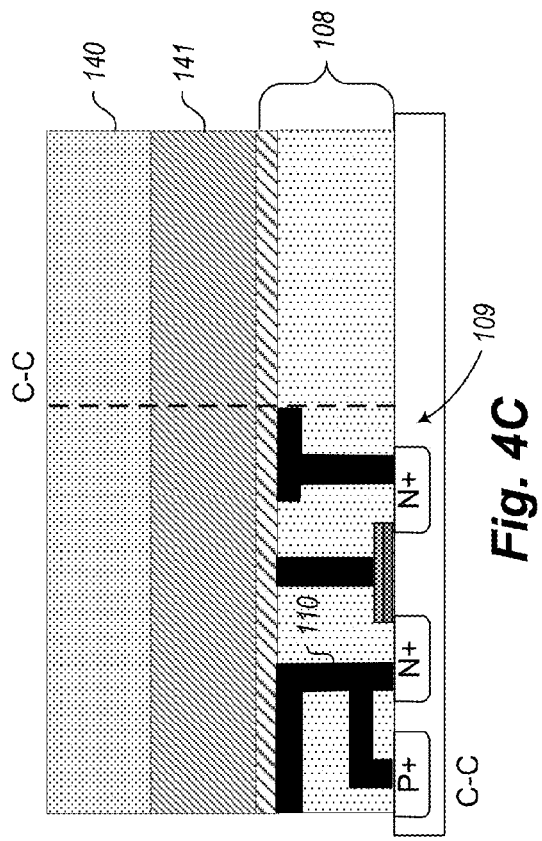
FIG. 4C is a cross-sectional view of the dielectric layer shown in FIG. 4A according to an alternative embodiment.
Figure 4A:
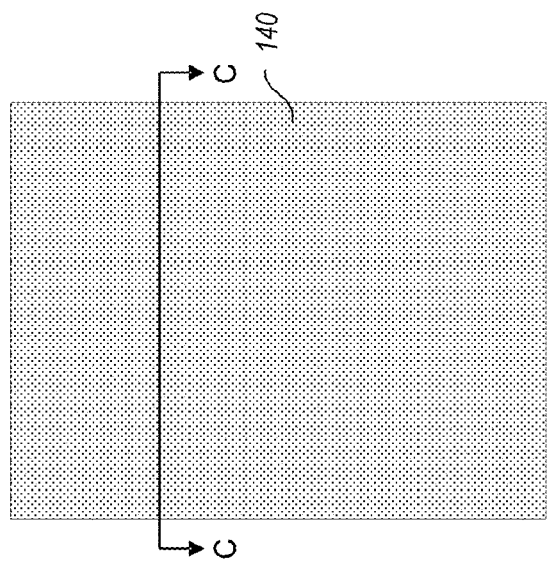
FIG. 4A is a top plan view of a dielectric layer.

FIG. 4A shows a top plan view of a dielectric layer 140 formed on the substrate 108 following step 122. FIGS. 4B and 4C show corresponding cross-sectional views of the dielectric layer 140 along a cross-section line C-C. The dielectric layer 140 can be made of a conventional dielectric material used for inter-layer dielectrics that are typically used to insulate metal interconnects in integrated circuits. Such materials include silicon dioxide, ultra low-k (ULK) dielectrics (e.g., carbon-doped, fluorine-doped $SiO_2$, or nonporous $SiO_2$), high-k dielectric materials (e.g., hafnium oxide), and the like. Alternatively, the dielectric layer 140 can be a multi-layer stack that includes a lower layer 141 made of, for example, ULK. The dielectric material can be selected according to its dielectric constant K by a circuit designer, according to a set of target circuit design specifications for that circuit.

The substrate 108 can be, for example, a silicon substrate in which a transistors 109 have been fabricated with one or more layers over it. The dielectric layer 140 can be an inter-layer dielectric that is part of a metal interconnect structure 110, i.e., a dielectric layer between, for example, first and second layers of metal interconnects, or between second and third metal layers, third and fourth metal layers, and so on. The dielectric layer 140 can be located directly above the transistors 109 (FIG. 4B), or, alternatively, the dielectric layer 140 can be located adjacent to the metal interconnect structure 110 that couples the transistors 109 to one another (FIG. 4C).

Specifically, as shown in FIG. 4B, the dielectric layer 140 is an intermetal dielectric of the type commonly used in integrated circuits to separate two metal levels from each other, such as metal 4 from metal 5. These intermetal dielectric are provided as standard layers in integrated circuits today. Preferably, layer 141 is an intermediate metal layer, such as metal 4 or metal 5 on top of which is formed the subsequent intermetal dielectric 140. The metal layer 140 is an interconnect layer which overlays another dielectric layer which acts as the substrate 108. For example, the layer 108 can also have an intermetal dielectric layer 140 as a part of it within which the structures as described in this application are also formed. Thus, the substrate 108 will be a base support material for the dielectric layer 140 and can itself be an equivalent layer 140 in which the inventive structures are formed and underneath which is additional substrate support including other intermetal layer dielectric, transistors, and the like. In the embodiment of FIG. 4B, the dielectric layer 140 is formed directly over operational transistors 109 which form the basis for the support substrate 108.

FIG. 4C illustrates that embodiment in which dielectric layer 140 is in a region spaced from being directly over the core transistors 109 of the integrated circuit. Specifically, in many integrated circuits there is a core logic area including many transistors 109, as well as memory areas. On the same integrated circuit may be significant areas which do not include a high density of transistors, for example, guard rings, capacitors, and other structures in and directly above the substrate. In this embodiment, the dielectric layer 140 in which the inventive modular structures are formed is off to the side and not directly over a larger area of transistors. This leaves the region directly over the transistors available for use for interconnection of circuits for operation of the integrated circuit. In this event, the region 140 is in a section of the chip in which dummy metal structures are often required in order to provide for smooth CMP polishing. As explained in more detail herein, the inventive modular fuse, antifuse, and inductors as formed here may be used in the same location as dummy metal structures would be placed, however, they have the benefit of being functional circuit elements and, thus, do not require any additional space. Therefore, incorporating the modular inventive structures herein requires no additional area or further layers of the integrated circuit. Rather, they are incorporated into already existing layers of the integrated circuit, are formed at the same time, in the same metal steps as other layers and do not require additional processing steps.

Figure 5A:
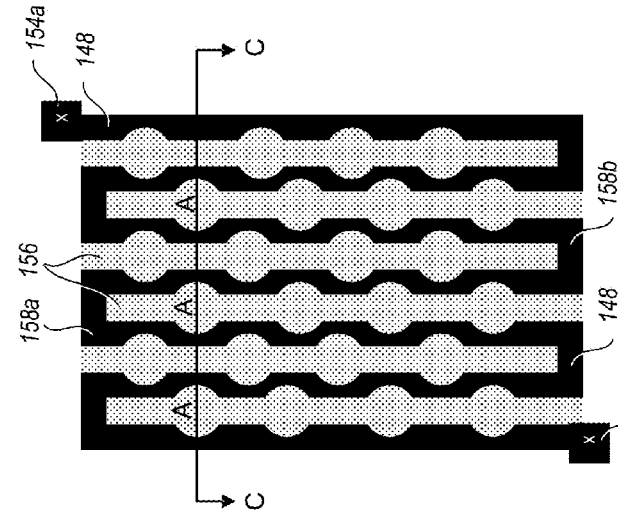
FIG. 5A is a top plan view of a patterned dielectric matrix for an efuse, according to one embodiment described herein.
Figure 5B:
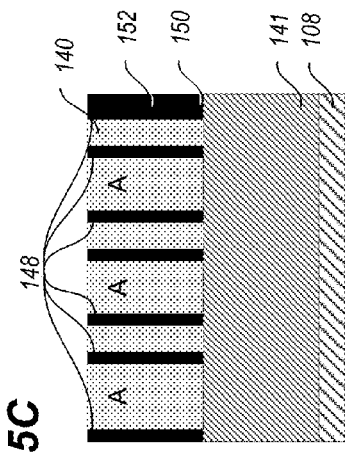
FIG. 5B is a cross-sectional view of the patterned dielectric matrix shown in FIG. 5A.

FIG. 5A shows a top plan view of a patterned dielectric layer 140 after formation of openings 142, following step 124. FIG. 5B shows a corresponding cross-sectional view of the dielectric layer 140 along a cut line C-C. The openings 142 can be etched using a conventional dielectric etchant, according to a reactive ion etching process, for example. An anisotropic etch is preferred to obtain vertical walls and columns. In the embodiment shown, the openings 142 are created so as to leave behind rows of dielectric columns A and B, connected by links 144 and 146, respectively, configured to create an efuse 126. According to one embodiment, the dielectric columns A and B are round cylinders, but the shape of the dielectric columns is not so limited. The links 144 and 146 are made narrower than the diameter of the dielectric columns A and B so as maintain separation between adjacent rows. Geometrical parameters of the dielectric columns A, B and links 144, 146 (e.g., the cross-sectional shape and diameter of the dielectric columns A, B, and the width of the links 144, 146) thus determine, in part, the breakdown condition for the efuse. For example, the dielectric columns A, B can have square or diamond-shaped cross sections.

The remaining material 144 is, thus, in the form of a wall of dielectric material with enlarged columns of dielectric material 145 at selected locations along the wall. These columns are labeled A along wall 144 and B along wall 146.

The openings 142 can be formed by a double patterning process in which multiple successive patterning cycles (i.e., lithography and etch cycles) are carried out. For example, a first patterning cycle creates a matrix of dielectric columns A connected by links 144 using a first lithographic mask. Then, a second patterning cycle creates a matrix of dielectric columns B connected by links 146, using a second lithographic mask in which substantially identical column and wall features are offset from those on the first lithographic mask. Use of such a double patterning process achieves a more closely packed array of dielectric columns A and B with a narrow spacing x (e.g., 10-20 nm), while the mask features need only contain an array of columns having a wide spacing W. Alternatively, the same lithographic mask can be used for both patterning cycles, wherein during the second patterning cycle, the mask is aligned so as to intersperse the pattern of dielectric columns B and links 146 mid-way between the pattern of dielectric columns A and links 144. Alternatively, a triple patterning process can be used in which, in a first patterning cycle, the dielectric columns A are masked by a first pattern of dots, followed by a second patterning cycle in which the dielectric columns B are masked by a second pattern of dots, followed by a third patterning cycle in which the links 144, 146 are masked by a pattern of lines, to connect the dots in rows.

Preferably, the walls which are composed of links 144, 146 and columns A and B are patterned and etched in the same etch step in which vias are formed between adjacent metal layers. For example, after metal 3 is formed, a dielectric layer overlays metal 3. Then, prior to the formation of metal 4, various holes are etched into the dielectric layer in order to form vias to provide electrical connection between metal 3 and metal 4. The same etch mask which is used for the vias can have additional patterns formed therein at different locations on the die where vias are not present in or otherwise open or unoccupied space of that particular dielectric layer. Accordingly, any location in the dielectric which is unused and otherwise open or vacant space can be selected to form the dielectric pattern of the walls as shown in FIG. 5A. The etching steps carried out to form the layers are the very same etching steps used to form the via and, therefore, no additional process steps are needed nor are any additional masks needed. Rather, the only modification is to modify the pattern which is on an existing mask so as to include the appropriate openings to etch the pattern as shown in FIG. 5A.

Figure 5C:
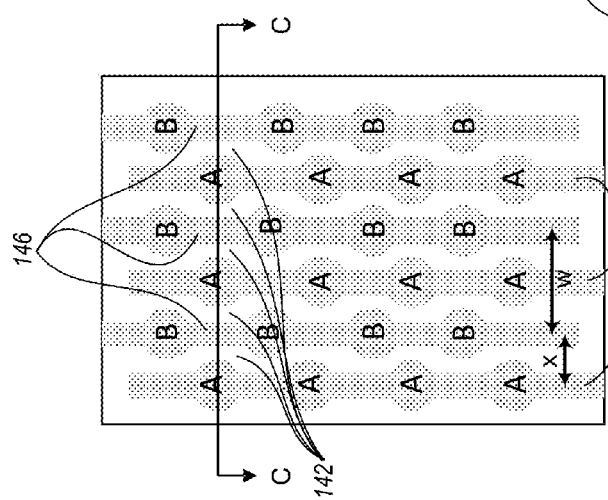
FIG. 5C is a top plan view of a metal serpentine resistor for use as an efuse.
Figure 5D:
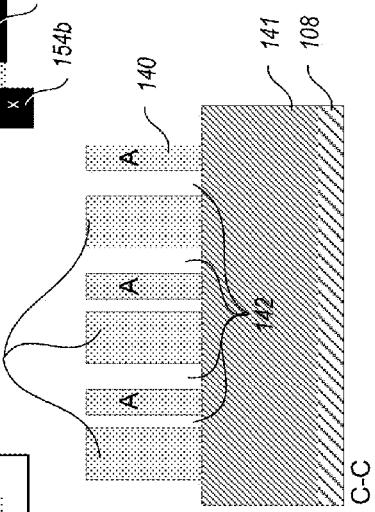
FIG. 5D is a cross-sectional view of the metal serpentine resistor shown in FIG. 5C.

FIG. 5C shows a top plan view of a metal serpentine resistor 148 inlaid in the dielectric layer 140 after deposition of a metal liner 150 at 132, filling with bulk metal 152 at 134, and polishing the bulk metal to stop on the dielectric layer 140. FIG. 5D shows a corresponding cross-sectional view of the metal serpentine resistor 148 along a cut line C-C. The metal serpentine resistor 148 is formed by metal deposited interstitially between the rows of dielectric columns A, B connected by the links 144, 146. In the exemplary embodiment shown, the metal liner includes a lower stack 150 of 6 nm tantalum on 2 nm tantalum nitride, and the bulk metal 152 is made of 50-100 nm of copper. Alternatively, other liner materials can be used, such as titanium or titanium nitride, and other bulk metals can be used such as, for example, aluminum, or tungsten. A length of the metal serpentine resistor 148 between two resistor contact pads 154a and 154b determines, in part, a resistance of the resulting efuse. For example, the length of the metal serpentine resistor 148 can be halved by altering the mask pattern to join the two central rows of dielectric columns and links 156, and placing extra contact pads at 158a and 158b. Of course, fewer rows 144 can be formed to provide a shorter resistor or more walls can be formed to create a longer resistor.

Specifically, the metal depositions to form the metal serpentine resistor 148 will be exactly those same which are made to form the via between the two metal levels being interconnected through the dielectric layer in which the layer 140 is formed. For example, if the via metal is copper, as is common in many integrated circuits today, generally, a copper via is formed by first depositing a thin liner layer of tantalum nitride after which a tantalum sealing layer is deposited thereon in order to seal and isolate the copper after which copper is formed, either by CVD deposition, plating (either electroless plating or electroplating), or some other technique. Thus, the fuse 146 is formed at exactly the same time using the very same metal deposition steps in which the vias between the two metal levels, such as metal 3 and metal 4 are being formed. This provides the benefit that no additional process steps are required and permits the formation of the fuse 146 and other modular structures described herein simultaneously with the formation of the integrated circuit structures which are interconnecting the transistors and the circuits of the die. The efuse 148 will therefore have the same height as the vias between the metal levels in which the dielectric layer 140 is positioned. The height of the fuse will therefore often be exactly the same height as the via and is not subject to the control of the designer in this particular embodiment. In such situations, the circuit designer can easily and precisely control the thickness of the efuse 148 by making the distance X very small and/or by making the columns large and close to each other so that the efuse 148 has a number of very thin regions which can easily heat up and be blown in order to break the circuit and carry out the fuse function. Thus, the formations of the columns A and B provide beneficial control of the breakdown characteristics of the efuse 148 and the current and voltage which will cause it to fail in order to protect the circuit components to which it is connected.

With reference to FIGS. 6A-6D, at 128, a different configuration of links, 164, can form a planar spiral coil to create an inductor. FIG. 6A shows a top plan view of the patterned dielectric layer 140 after formation of openings 162, following 128. FIG. 6B shows a corresponding cross-sectional view of the dielectric layer 140 along a cut line C-C. The openings 162 can be etched using a conventional dielectric etchant, according to a reactive ion etching process or a wet chemical etching process, for example. In the embodiment shown, the openings 162 are created so as to leave behind dielectric columns A and B, connected by a spiral configuration of links 164 configured to define an inductor following deposition of metal in the openings 142.

FIG. 6C shows a top plan view of a completed inductor 166. FIG. 6C shows a metal planar coil 168 inlaid in a spiral configuration in the dielectric layer 140 after deposition of the metal liner 150 at 132, filling with bulk metal 152 at 134, and planarizing the bulk metal to stop on the dielectric layer 140. FIG. 6D shows a corresponding cross-sectional view of the metal planar coil 168 along a cut line C-C. The metal planar coil 168 is formed by metal deposited interstitially between the rows of dielectric columns A, B connected by the spiral configuration of links 164. In the exemplary embodiment shown, the metal liner includes a stack of 6 nm tantalum on 2 nm tantalum nitride, and the bulk metal is made of 50-100 nm of copper. Alternatively, other liner materials can be used, such as titanium or titanium nitride, and other bulk metals can be used such as, for example, aluminum, or tungsten. A length of the metal planar coil 168 between two inductor contact pads 170a and 170b determines, in part, the inductance of the inductor 166. For example, the length of the metal planar coil 168 can be changed by altering the mask pattern to join fewer dielectric columns A, B. Dielectric columns A, B that are not joined as part of the metal planar coil 168 can serve as dummy structures for a planarization process.

Of course, when it is desired to form an inductor 166 using the metal layer 168, the width of the inductor, namely the distance between adjacent columns A and B or, in some cases adjacent columns A, is selected to provide a desired thickness for the inductor. Generally, when an efuse is formed it is desired to have it relatively thin in places so that if excessive current travels through the metal layer, the fuse will break and, thus, create an open circuit in the connection. Thus, the spacing between adjacent walls and adjacent columns A and B is selected to create a desired break down voltage and/or current for the efuse in the embodiments of FIGS. 5A and 5C. On the other hand, it is generally desired that the inductor continue to operate over the life of the product. In this instance, the spacing between the adjacent walls and columns might be significantly larger to provide a relatively thick layer of metal for the inductive coil, thus, providing a large margin of safety even if excessive current flows through the inductor to ensure the inductor does not break during operation.

In one embodiment, columns A and B are not provided as dielectric columns in the pattern, rather the dielectric is a uniformly thick wall so that the inductor has a uniform thickness along its entire length. In such designs, it is desired to ensure that the wall has sufficient thickness that it does not collapse as sometimes happens as discussed with respect to FIG. 2B. Thus, the designer has the option to either form a single wall with a uniform thickness resulting in an inductor coil which has uniform thickness throughout its entire length or, alternatively, to form columns A and B along the length of the wall to provide strengthening characteristics while at the same time reducing the distance between adjacent coils by having thinner dielectric at selected locations.

At 130, a dielectric mesh network 164 can be formed in place of the vertical dielectric films 106 in an antifuse according to one embodiment shown herein. FIG. 7A shows a top plan view of the patterned dielectric layer 140 after formation of columnar openings X, Y, Z, following 130. FIG. 7B shows a corresponding cross-sectional view of the dielectric layer 140 along a cut line D-D. The columnar openings X, Y, Z can be etched using a conventional dielectric etchant, according to a reactive ion etching process or a wet chemical etching process, for example. In the embodiment shown, the columnar openings X, Y, Z are created so as to leave behind a dielectric mesh network 174 that has a low breakdown voltage but is also structurally stable and will not tend to collapse. The columnar openings X, Y, Z can be formed, for example, by a triple patterning process as shown, in which three successive patterning cycles (i.e., lithography and etch cycles) are carried out to form closely interspersed arrays of columnar openings X, Y, and Z, in similar fashion as the double patterning process described above. Alternatively, the double patterning process described above can be used. Alternatively, a single patterning process can be used if a patterning capability is achieved that reliably forms such closely interspersed columnar openings X, Y, Z, in which the columnar openings X, Y, Z are spaced apart by a dielectric mesh network 174 having nanometer-scale dimensions.

FIG. 8A shows a top plan view of a fully etched antifuse dielectric 176, in which a pair of electrode openings 178a, 178b have been formed on either side of the array of columnar openings X, Y, Z. The electrode openings 178a, 178b can be formed either by a separate patterning cycle following formation of the array of columnar openings X, Y, Z, or the electrode openings 178a, 178b can be formed during the same single, double, or triple patterning cycle used to form the array of columnar openings X, Y, Z. A separation distance 179 between the pair of electrodes 178a, 178b determines, in part, the breakdown voltage of the antifuse. Optionally, partial electrode openings 180a can also be formed at various distances from the electrode openings 178a, 178b to create one or more antifuses having smaller separation distances 182 and therefore a smaller breakdown voltage. The shortest distance between features FIG. 8B shows a corresponding cross-sectional view of the fully etched antifuse dielectric 176 along a cut line D-D. The opening 180b can be formed a distance 183 from the other electrode 178b.

In particular, the structure of FIGS. 8A and 8C will form a variety of different capacitors each having a different distance between the plates and different dielectric constant. A first capacitor is formed between plate 178a and plate 180a. These are separated by a short distance 182 and, in fact, the actual distance would be the thickness of the dielectric material at its thinnest location where the breakdown can be most easily achieved when a high voltage is applied. Another capacitor is formed between 178a and 180b which has a greater distance between the two plates. The dielectric material between 178a and 180b will be somewhat thicker and, thus, have a larger breakdown voltage. Further, an intermediate breakdown voltage can be formed by the capacitor having plate 178b and 180b, since the distance between these two is somewhat shorter than that of the capacitor between 178a and 180b, but is greater than the distance between the capacitor plates for 178a and 180a. Thus, the capacitor with the greatest distance will be one formed between the plates 178a and 178b. This dielectric constant will be determined by not only the distance but the number of apertures X, Y, and Z which are formed and the relative locations with respect to the dielectric material between these two capacitor plates. Yet another capacitor is formed between the plates 178b and 180a which is an intermediate level capacitor between the largest capacitance and the next smaller one. Accordingly, at least five capacitors can be formed by the structure of FIG. 8A. The apertures X, Y, and Z will assist to determine the breakdown voltage of the capacitor.

The location, size, and shape of the apertures X, Y, and Z and the metal which fills them can be selected to also perform the function of a metal structure to assist in the metal planarization process during CMP and, thus, replace the dummy metal structure or be considered a part of the dummy metal structures. Accordingly, these apertures, including their size and location, can be selected more for their assistance in the planarization process than the requirement to provide a precise capacitance for the particular capacitors formed therein. Generally, for antifuses the exact value of the capacitance is not so important as the ability to provide a reliable short circuit upon a certain voltage being exceeded. Accordingly, the structures are formed with a variety of dielectric distances between adjacent plates so that the designer can select any one of the many available capacitors for the antifuse function for the particular circuit. Thus, amongst the dummy metal structures which are being formed, these structures can be formed which perform the dual function of being also antifuses for any circuits which the designer may desire to protect on the integrated circuit.

FIG. 8C shows a completed antifuse 184, formed by depositing metal into the columnar openings X, Y, Z and into the electrode openings 178a, 178b (and, if used, the partial electrode openings 180) to form an array of metal columns D, E, F flanked by a pair of electrodes 188a, 188b (and, if used, partial electrodes 190), respectively. FIG. 8D shows a corresponding cross-sectional view of the completed antifuse 184 along a cut line D-D. In the exemplary embodiment shown, the metal includes a metal liner stack of 6 nm tantalum on 2 nm tantalum nitride, and the bulk metal is made of 50-100 nm of copper. Alternatively, other liner materials can be used, such as titanium or titanium nitride, and other bulk metals can be used such as, for example, aluminum, or tungsten. As previously noted, the fill material will generally be the very same fill material which is being used for the vias between the adjacent metal interconnect levels above and below the dielectric layer. Thus, if the via is being formed from copper with the appropriate liners and barrier layers then the fill will be made of the same material, using the same process steps. Alternatively, if the via is being formed of tungsten which normally has a titanium and/or titanium nitride liner, followed by tungsten, then the fill material will be the titanium/titanium nitride liner followed by tungsten. Similarly, if aluminum is being used as the via metal, then aluminum will be used as the fill material, again similar to the metal deposition described with respect to the embodiments of FIGS. 5C and 6C. It is noted that the electrodes 188a, 188b intersect a row of the array of metal columns D, E, F and that the partial electrodes 190 intersect a portion of a row of the array of metal columns D, E, F inlaid in the dielectric mesh network 174. The intersected metal columns thus become part of the electrodes 188a, 188b, 190. Intersected metal columns D, E, F are separated by a narrowest dielectric distance 196, thus forming a very low voltage antifuse that is particularly sensitive. Other metal columns which are not intersected by electrodes 188a, 188b, 190 do not participate in a microelectronic circuit, but serve as dummy structures for a metal planarization process.

According to one benefit, the metal structures of FIGS. 5C and 6C, and those to be formed etching in FIG. 7A as described with respect to FIG. 8C and other figures, can also perform the dual function of assisting in the metal planarization process. It is well known in the art that CMP is performed after vias are formed between two metal layers. The CMP step is carried out in order to planarize the via metal layer prior to the deposition of the next level of interconnect. During the planarization process, if there are significant locations on the chip in which no metal is present and only the dielectric is present, uneven polishing will take place and planarization is not properly carried out. Accordingly, it is known in the art to provide a large number of dummy metal structures in various patterns at different locations on the die in order to assist in the metal planarization process. One patent that discusses such dummy structures is U.S. Pat. No. 8,466,560 by Zang et al. This patent describes the need for dummy structures and their placement at selected locations on the wafer. Beneficially, the metal columns and lines formed herein can be placed in the those location in which dummy structures would otherwise be required. Thus, empty space on a die which previously had to be filled with dummy structures to assist in CMP planarization can now be used by circuit elements such as inductors, fuses, antifuses, and the like.

Previously, it has been difficult to form inductors on a die because of the large space required by inductors. Recently, integrated circuits have had the need for large dummy metal structures to assist in the planarization process between upper metal layers, for example between layers 4 and 5 and 5 and 6, because in such layers there is a large amount of open space. According to the techniques as taught herein, that space can now be used for fuses of the type which will be used to replace redundant memory, protect circuit elements or other fuse needs. It can also be used for antifuses to protect circuit elements, inductors, and the like. It can also perform the dual function of assisting in the planarization process by providing additional metal structures where otherwise dummy structure would have been required. In current chips with many metal layers, sometimes in excess of 10 or 12 layers, there will be significant area in the dielectric layers between each pair of metals in which capacitors and inductors can be formed. Thus, the need for off-chip capacitors and inductors can be reduced by forming them as taught herein.

Alternative embodiments for the antifuse 184 are shown as top plan views in FIGS. 9A-10B. In FIGS. 9A and 9B, a size of the dielectric mesh network 174 is varied to change the antifuse sensitivity. For example, in FIG. 9A the dielectric mesh network 174 is very narrow, creating a very sensitive antifuse having a low breakdown voltage. In FIG. 9B, the dielectric mesh network 174 located between the electrodes 188a, 188b is wide and encompasses many more metal columns D, E, creating a less sensitive antifuse having a high breakdown voltage.

As can be seen in FIG. 9A, there can be considered at least three different strengths of antifuses. The first one is between capacitor plates 188a and 188b being separated by the corrugated wall having apertures D and E partially therein. A second capacitor is formed between the solid dielectric layer between 188b and 188a in the center of the structure of FIG. 9A. This will have a significantly higher dielectric constant and a much greater thickness since the breakdown voltage must be sufficient to breakdown the dielectric which is a uniform thickness and extends down the very center of the structure of FIG. 9A. A third, and even greater, dielectric breakdown voltage will be between 188a at the left-hand most side and 188b at the right hand most side. This would require a voltage sufficient to breakdown the dielectric constant of both of the corrugated walls of D and E, as well as the thick single wall in the center.

FIG. 9B shows the capacitor having two plates 188a and 188b and the thickness 174 between the two can be selected in order to provide a desired breakdown voltage for an antifuse.

Figure 10B:
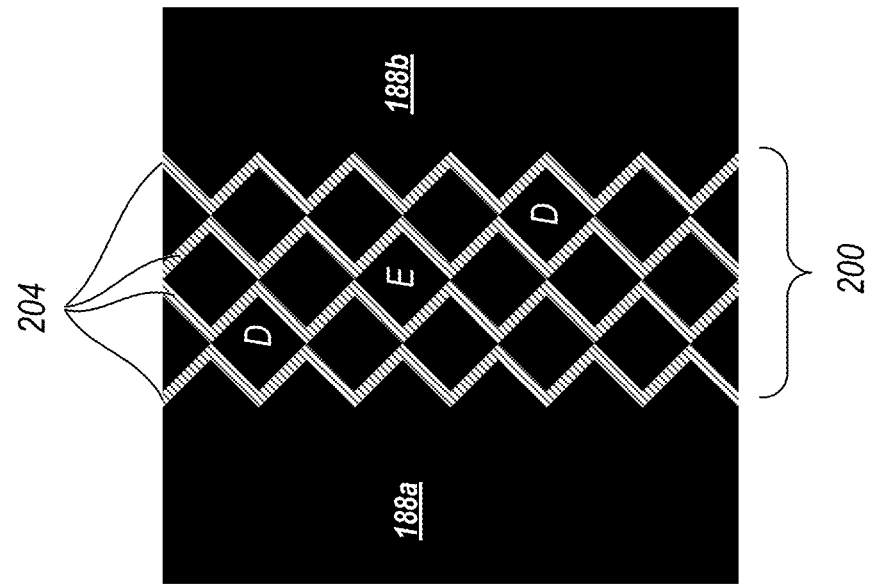
FIG. 10B is a cross-sectional view of the parallel plate capacitor shown in FIG. 10A.
Figure 10A:
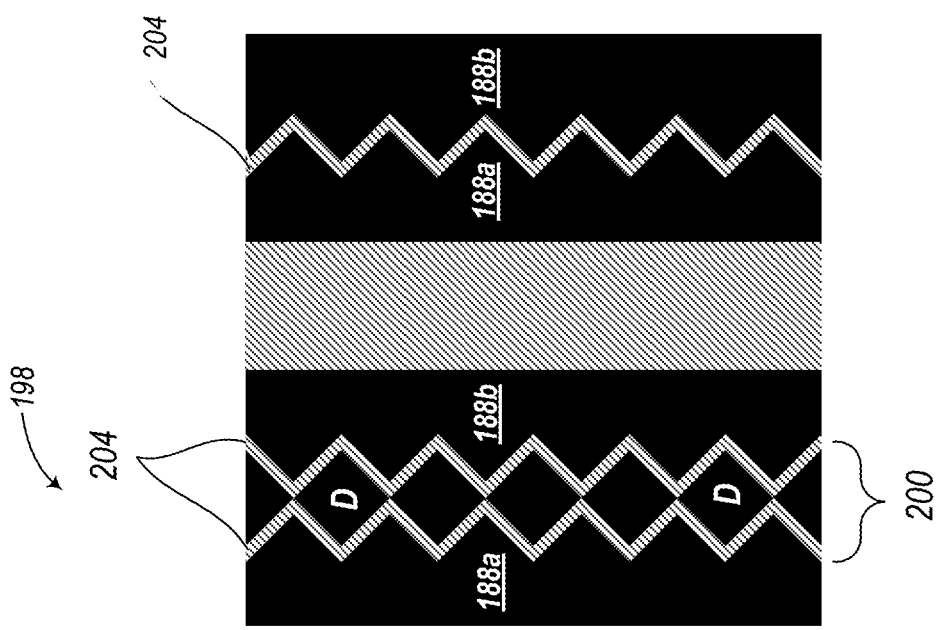
FIG. 10A is a top plan view of a parallel plate capacitor for use as an antifuse, according to a third embodiment.

Further alternative embodiments for the antifuse 184 are shown in FIGS. 10A and 10B in which a shape of the metal columns D, E is varied to change the antifuse sensitivity. For example, in FIG. 10A, an antifuse 198 includes a zigzag dielectric mesh network 200 that encompasses only one row of diamond-shaped metal columns D. A surface of each of the electrodes 188a, 188b of antifuse 198 has a zigzag profile, as do the two intervening dielectric films 204 within the zigzag dielectric mesh network 200. In FIG. 10B, the zigzag dielectric mesh network 200 encompasses three rows of diamond-shaped metal columns D, E, and four intervening dielectric films 204.

Generally, the metal columns D are isolated electrically from each other. Namely, the zigzag column 204 is connected at the center region so that each diamond shaped structure D is in electrical isolation from all the other diamond shaped structures D. As can be seen, the structure of FIG. 10A provides a uniform thickness wall 204 which can act as the dielectric film between two plates of a capacitor functioning as an antifuse. The capacitor on the left as shown in FIG. 10A will have a higher breakdown voltage than the capacitor on the right, which has only a single layer 204. The capacitor in the middle, which has the solid dielectric wall between plates 188b and 188a will have a higher breakdown voltage than the other two capacitors.

Figures 11A, 11B:
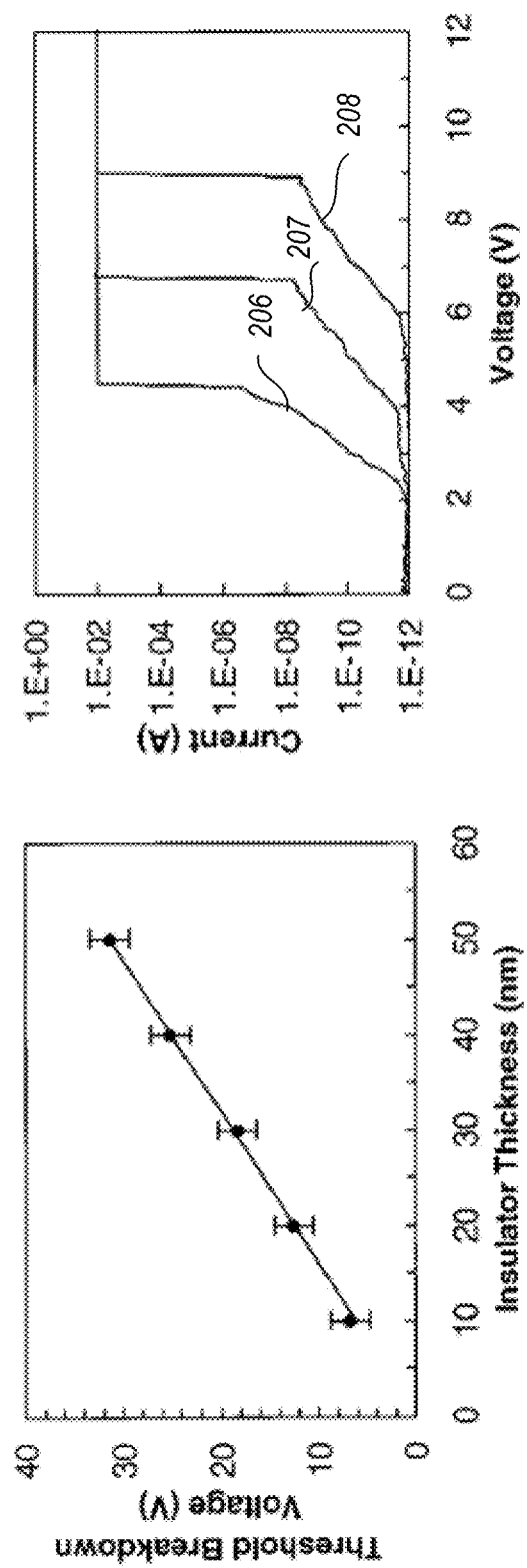
FIG. 11A is a plot of breakdown voltage as a function of dielectric film thickness for an antifuse.
FIG. 11B is a plot of current through an antifuse as a function of applied voltage, showing breakdown for several different antifuses.

FIG. 11A shows a relationship between threshold breakdown voltage of a microelectronic antifuse and insulator thickness for nanoscale dielectric films having thicknesses the range of 10-50 nm. Breakdown voltages range from about 7 V for a 10 nm thick dielectric to about 30 V for a 50 nm thick dielectric. FIG. 11B shows three current-voltage curves 206, 207, and 208 for microelectronic antifuse devices. The current-voltage curve 206 shows that breakdown occurs at about 4.4 V; the curve 207 shows that breakdown occurs at about 6.7 V; and the curve 208 shows that breakdown occurs at about 9 V. If an antifuse is targeted for a breakdown voltage of 6 V, the plot shown in FIG. 11A shows that the corresponding dielectric thickness is less than 15 nm. Using the nanofabrication techniques described herein, antifuses having dielectric thicknesses of less than 15 nm can be reliably constructed to break down within the range of 4-10 V.

At 132, instead of patterning the electrodes 178a, 178b, links 209 can be formed in a spiral configuration to create a fully etched inductor dielectric network 210. FIG. 12A shows a top plan view of the inductor dielectric network 210 following formation of columnar openings X, Y, Z and links 209 in the dielectric layer 140. FIG. 12B shows a corresponding cross-sectional view of the fully etched inductor dielectric 210 along a cut line D-D. The links 209 can be etched in a separate patterning cycle using a separate mask step. Alternatively, the links 209 can be formed in the same mask step as the columnar openings X, Y, Z.

FIG. 12C shows a top plan view of a completed antifuse-like inductor 211 in which metal has been inlaid into the fully etched antifuse-like inductor dielectric 208. FIG. 12C shows a metal planar coil 212 inlaid in a spiral configuration into the inductor dielectric network 210 after completion of a metal deposition process. The metal deposition process includes depositing the metal liner 150 at 134, filling with bulk metal 152 at 136, and planarizing the bulk metal at 138 to stop on the dielectric 140. FIG. 12D shows a corresponding cross-sectional view of the metal planar coil 212 along a cut line D-D. The metal planar coil 212 is formed by metal deposited into the columnar openings X, Y, Z (X,Y,Z) to form the array of metal columns D, E, and into the spiral configuration of links 209. In the exemplary embodiment shown, a metal liner is deposited that includes a stack of 6 nm tantalum on 2 nm tantalum nitride, and the bulk metal is made of 50-100 nm of copper. Alternatively, other liner materials can be used, such as titanium or titanium nitride, and other bulk metals can be used such as, for example, aluminum, or tungsten. A length of the metal planar coil 212 between two inductor contact pads 214 and 216 determines, in part, the inductance of the antifuse-like inductor 211. For example, the length of the metal planar coil 212 can be changed by altering the mask pattern to join fewer metal columns D, E. Metal columns D, E that are not joined as part of the metal planar coil 212 serve as dummy structures for a metal planarization process. In summary, the dielectric layer between intermetal dielectric layers between two metal interconnect layers includes, in various portions of the die, a large number of dummy structures in the form of columns of metal in order to assist in the planarization process. The location, shape and spacing of these dummy structures is selected to improve the planarization process during CMP. According to one aspect of the embodiments as described herein, the dummy structures which are otherwise electrically isolated and non-active parts of the circuit can be electrically joined to each other by etching an aperture between two structures so that the two become electrically joined. If desired, multiple ones of the dummy structures could be joined as illustrated in the prior FIGS. 8A-10B in order to form the desired electrical component such as an antifuse, an efuse, an inductor, a capacitor, or other electrical components. By selectively forming a connection between dummy structures already present in the mask, the desired electrical component can be formed, whether a resistor, capacitor, or inductor, which can then be used as a part of the circuit. While it would be appreciated that the use of such dummy structures to form capacitors and inductors will not always result in a precise value for the capacitance and inductance, many circuit components do not need precise values for these components, so much as having such components on chip.

Of course, if it is desired to form an operational capacitor and not an antifuse, this can also be done using the techniques as taught herein. With many metal layers and large inter-metal dielectrics, a large area is available on the circuit for many capacitor plates and dielectric layers if desired.

Accordingly, a structure which has been useful only for CMP planarization, namely, dummy metal columns, can now perform the traditional function of being useful for electrical circuit components. Of course, the shape and location of the electrical components can be modified in order to improve their electrical characteristics and it is not necessary for them to be functioning in the dual mode of metal planarization as well. Even if such structures were present, it is still permitted to provide or not provide dummy structures to assist in CMP planarization processes.

The antifuse-like inductor 210 is formed by an array of metal columns D, E that is arranged in an offset matrix. A hexagonal surface profile is determined by selection of metal columns D, E joined by the links 209. For example, certain ones of the metal columns D, E arranged in an offset matrix can be programmably selected. FIG. 13 shows an alternative embodiment of a completed antifuse-like inductor 218 formed by an array of metal columns D, E that is arranged in a square matrix. A square surface profile is determined by selection of metal columns D, E joined by the links 209. For example, certain ones of the metal columns D, E arranged in a square matrix can be programmably selected.

Figure 14:
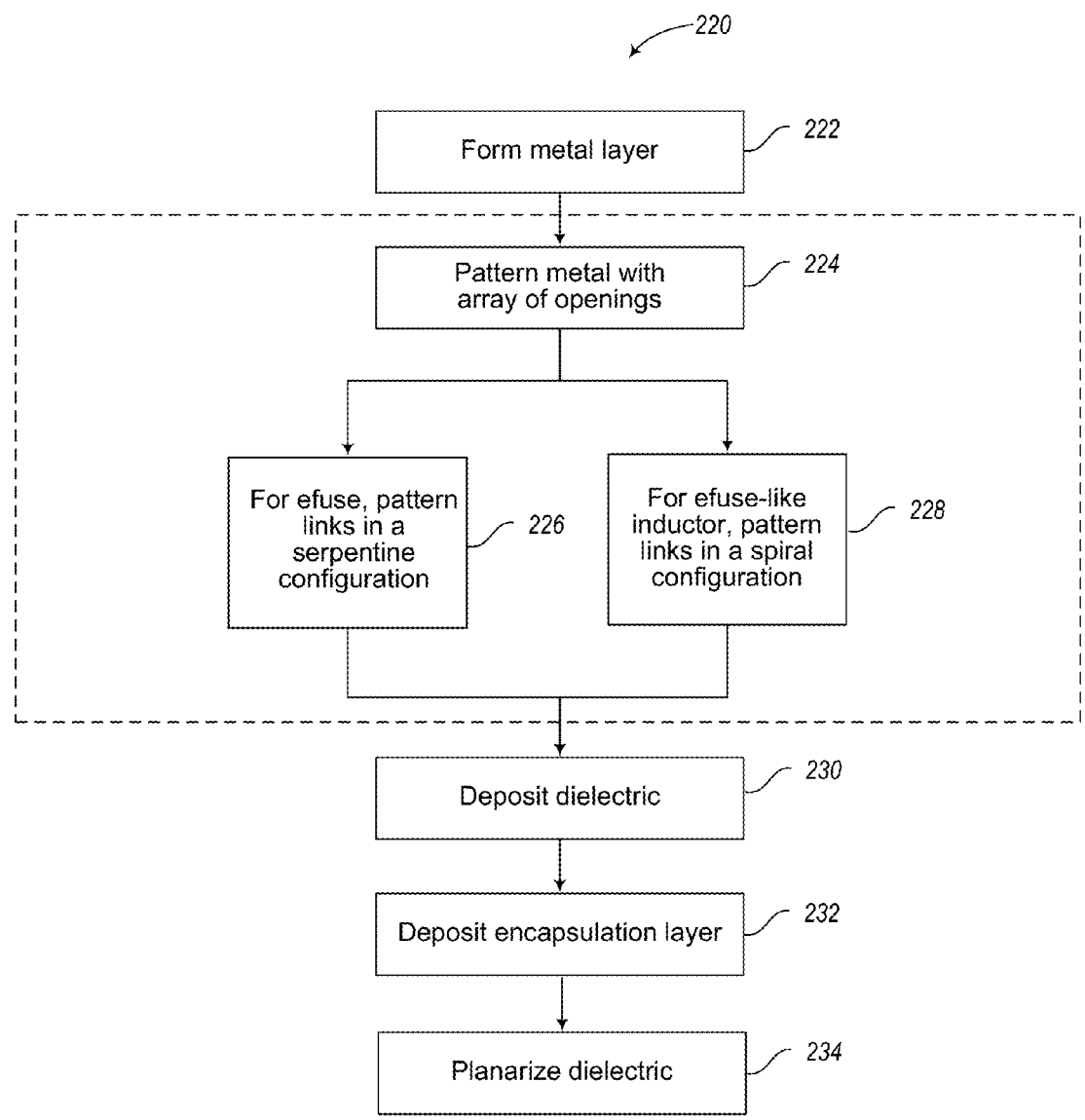
FIG. 14 is a high-level flow diagram describing a fabrication process that can be used to create efuses and efuse-like inductors.

FIG. 14 shows an alternative high level process flow 220 of a sequence of steps using a metal patterning approach. The alternative high level process flow 220 can be used to form a vertical microelectronic efuse or an efuse-like inductor.

At 222, a metal layer is formed.

At 224, the metal block is patterned with an array of openings.

At 226, if an efuse is desired, the metal layer can be further patterned with serpentine links to create resistors.

At 228, if an efuse-like inductor is desired, the metal can be patterned with links to connect selected openings in a spiral configuration.

At 230, the openings and links are filled with a dielectric.

At 232, a metal encapsulating layer is deposited to passivate the surface of the device.

At 234, the dielectric is planarized.

FIG. 15A shows a top plan view of a metal layer 240 that has been formed on the substrate 108 following step 222. FIG. 15B shows a corresponding cross-sectional view of the metal layer 240 along a cut line C-C. The metal layer 240 can include, in addition to a bulk metal, a metal liner 242 configured as a stack of 6 nm tantalum on 2 nm tantalum nitride. Alternatively, other liner materials can be used, such as titanium or titanium nitride. In one embodiment, the bulk metal is made of 50-100 nm of copper. Other bulk metals can be used such as those typically used for metal interconnects in integrated circuits; for example, aluminum, gold, platinum, titanium, tungsten, and the like. Preferably, the metal layer 240 is one of the layers which is a metal interconnect. Namely, a structure which has previously been used only as a metal interconnect structure, such as for metal 4 and metal 5, will have some portion which is selectively etched in order to provide the efuses, inductors, antifuses and the like. Accordingly, according to one preferred embodiment, the metal layer 240 is formed at the same time and is part of the same step as forming the interconnect metal layer in the integrated circuit and layer 241 is the intermetal dielectric. The substrate 108 can be a lower substrate of the type described with respect to FIGS. 4B and 4C. The metal layer 240 can be formed on top of a lower layer 241 made of a dielectric such as silicon dioxide ($SiO_2$).

FIG. 16A shows a top plan view of the patterned metal layer 240 after formation of openings 243, following step 224. FIG. 16B shows a corresponding cross-sectional view of the metal layer 240 along a cut line C-C. The openings 243, arranged as an array of cylindrical holes, can be etched in the copper using a conventional metal etch chemistry that is typically used for etching aluminum or aluminum-copper alloys, such as for example, a chlorine ($CL_2$)-based reactive ion etching process. However, to etch copper, such a process can be carried out at a low temperature such as −90 C to prevent formation of a surface layer of $CuCl_2$, which inhibits etching the copper.

The columnar openings X, Y can be formed by a double patterning process in which multiple successive patterning cycles (i.e., lithography and etch cycles) are carried out as explained above. For example, a first patterning cycle creates a matrix of columnar openings X using a first lithographic mask. Then, a second patterning cycle creates a matrix of columnar openings Y using a second lithographic mask in which substantially identical circular cylindrical holes are offset from those on the first lithographic mask. Use of such a double patterning process achieves a more closely packed array of columnar openings X and Y having a narrow spacing (e.g., 10-20 nm), while the mask features need only contain an array of columns having a wide spacing. Alternatively, the same lithographic mask can be used for both patterning cycles, wherein during the second patterning cycle, the mask is aligned so as to intersperse the pattern of openings Y mid-way between the pattern of columnar openings X.

FIG. 17A shows a top plan view of the metal layer 240 after a subsequent patterning cycle has formed linear openings 244a and 244b connecting the columnar openings X, Y. In one embodiment, the linear openings 244a are cut through the metal at the bottom of the array, while the adjacent linear openings 244b are cut through the metal at the top of the array so as to leave behind a continuous metal serpentine resistor 248. FIG. 17B shows a corresponding cross-sectional view of the patterned metal layer 240 along a cut line C-C. FIG. 17C shows a top plan view of the inlaid metal serpentine resistor 248 after the columnar openings X, Y and the linear openings 244a, 244b are filled with a dielectric (e.g., a ULK dielectric) at step 230, forming the dielectric columns A, B. FIG. 17D shows a corresponding cross-sectional view of the inlaid metal serpentine resistor 248 along a cut line C-C. The inlaid metal serpentine resistor 248, formed by the low-temperature copper etch process, is substantially the same as the inlaid metal serpentine resistor 148 (shown in FIG. 5C) formed by the damascene process described above.

Figure 18B:
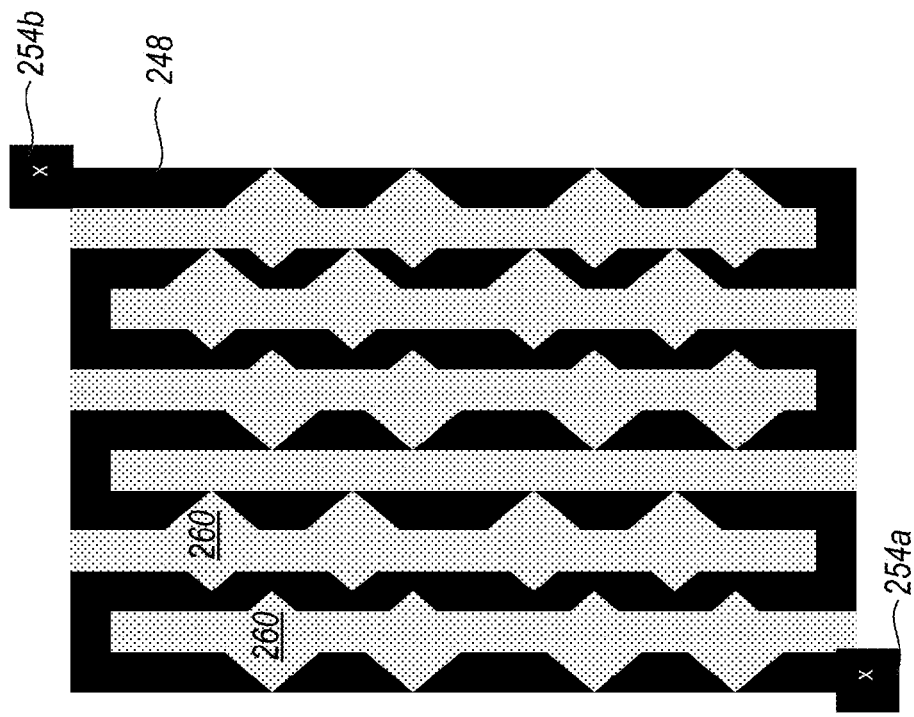
FIG. 18B is a top plan view of a metal serpentine resistor, according to a third embodiment.
Figure 18A:
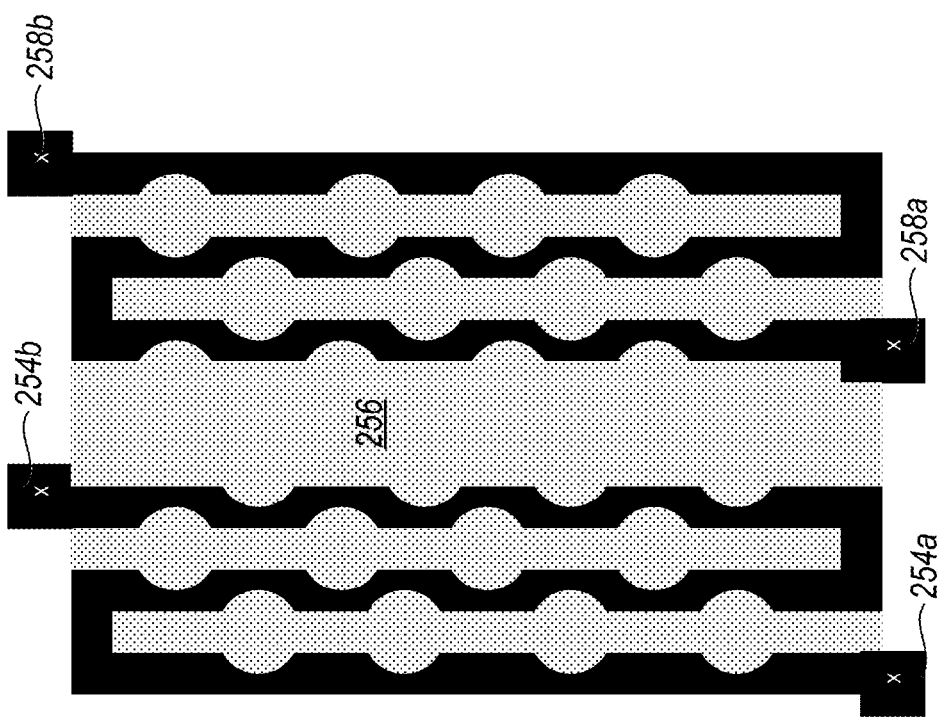
FIG. 18A is a top plan view of a pair of metal serpentine resistors, according to a second embodiment.

A length of the metal serpentine resistor 248 between two resistor contact pads 254a and 254b determines, in part, a resistance of the resulting efuse. In FIG. 18A the length of the metal serpentine resistor 248 can be halved by altering the mask pattern to join the two central rows of dielectric columns and links by patterning a wide dielectric field 256, and placing extra resistor contact pads at 258a and 258b.

According to one embodiment, the dielectric columns A and B are round cylinders, but the shape of the dielectric columns is not so limited. Geometrical parameters of the dielectric columns A, B (e.g., the cross-sectional shape and diameter of the dielectric columns A, B) thus determine, in part, the breakdown condition for the efuse. For example, the dielectric columns A, B can have square or diamond-shaped cross sections 260 as shown in FIG. 18B. The shape of the dielectric columns provides another way to modulate the efuse breakdown voltage or current. For example, as can be seen in FIG. 18B, if the dielectric column is in the shape of a diamond 260, then the efuse structure 248 will have a number of weak points along its length any one of which can heat up and break in order to provide the fuse function.

At 228, a different configuration of links, 264, can form a planar coil to create an efuse-like inductor. FIG. 19A shows a top plan view of the patterned metal layer 240 after formation of the array of columnar openings X, Y connected by linear openings 262 that link the columnar openings X, Y in a spiral configuration, following step 228. FIG. 19B shows a corresponding cross-sectional view of the metal layer 240 along a cut line C-C. The columnar openings X, Y and linear openings 262 can be etched using the low-temperature metal etch process described above so as to leave behind the desired metal planar coil 268. FIG. 19C shows a top plan view of a completed inductor 266 in the form of the metal planar coil 268. FIG. 6D shows a corresponding cross-sectional view of the metal planar coil 268 along a cut line C-C. A length of the metal planar coil 168 between two inductor contact pads 270a and 270b determines, in part, the inductance of the inductor 266. For example, the length of the metal planar coil 268 can be changed by altering the mask pattern to join fewer dielectric columns A, B. Dielectric columns A, B that are not joined to define the metal planar coil 268 serve as dummy structures for an ILD planarization process.

Figure 20B:
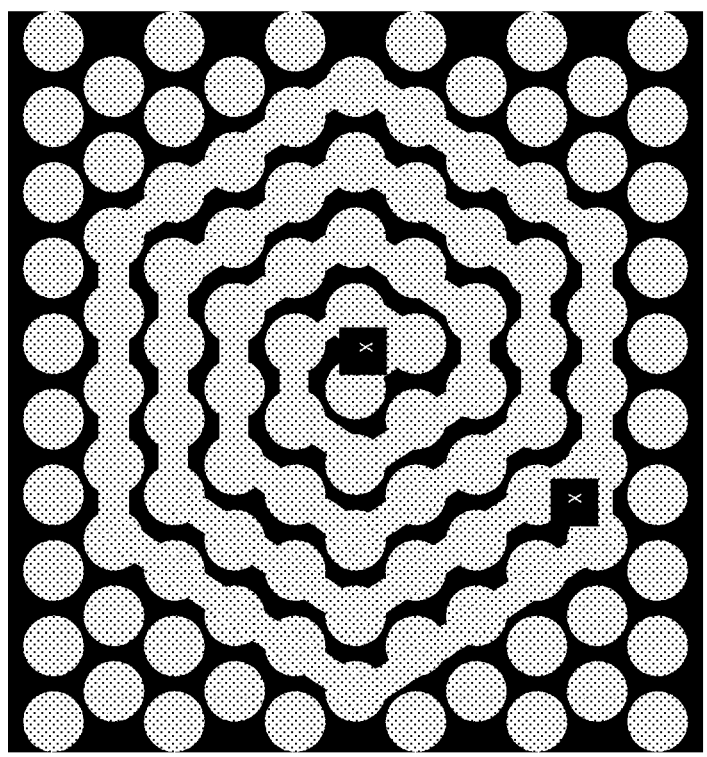
FIG. 20B is a top plan view of a hexagonal metal coil corresponding to an efuse-like inductor, according to one embodiment.
Figure 20A:
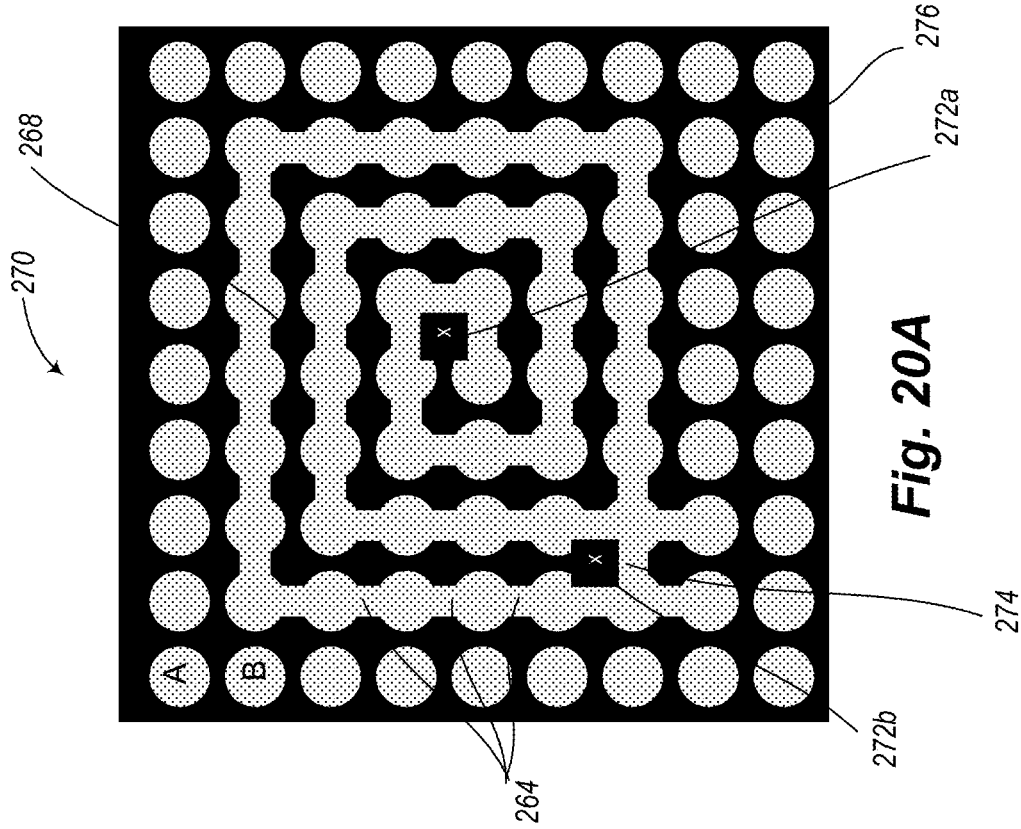
FIG. 20A is a top plan view of a square metal coil corresponding to an efuse-like inductor, according to one embodiment.

An inductor 266 is formed by the interstitial metal in an array of dielectric columns A, B arranged in an offset matrix. A square surface profile is determined by selection of dielectric columns A, B joined by the links 264. For example, certain ones of the dielectric columns arranged in an offset matrix can be programmably selected. FIG. 20A shows an alternative embodiment of a completed inductor 270 formed by the interstitial metal in an array of dielectric columns A, B arranged in a square matrix. Contact pads 272a and 272b mark the ends of the inductor coil. A square surface profile is determined by selection of dielectric columns joined by the links 264. For example, the end of the inductor coil is defined by an end link 274 that can be programmably selected to isolate the planar metal coil 268 from the remaining interstitial metal mesh 276 that is not part of the inductor.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectronic antifuse comprising:
    an array of metal columns inlaid in a dielectric block so as to form a dielectric mesh network; and
    a pair of electrodes, each electrode intersecting at least a portion of one row of the array of metal columns, the pair of electrodes arranged in parallel so as to form, together with the intersected metal columns, a pair of vertical capacitor plates, a resistance across the dielectric mesh network located between the pair of vertical capacitor plates encoding an on/off state of the antifuse.

2. The antifuse of claim 1 wherein the array of metal columns is arranged as a square matrix.

3. The antifuse of claim 1 wherein the array of metal columns is arranged as an offset matrix in which alternate rows of columns are offset from one another by a fixed distance to form a thin dielectric mesh network.

4. The antifuse of claim 1 wherein an antifuse voltage is determined in part by a volume of the metal columns.

5. The antifuse of claim 1 wherein an antifuse voltage is determined in part by a shortest distance separating the pair of vertical capacitor plates.

6. The antifuse of claim 1 wherein the metal columns that are not intersected by an electrode serve as dummy structures for a metal planarization process.

7. The antifuse of claim 1 wherein the row of the array of metal columns is programmably selected.

8. A microelectronic, antifuse comprising;
    an array of metal columns inlaid in a dielectric block so as to form a dielectric mesh network; and
    a pair of electrodes, each electrode intersecting at least a portion of one row of the array of metal columns, the pair of electrodes arranged in parallel so as to form, together with the intersected metal columns, a pair of vertical capacitor plates, a resistance across the dielectric mesh network located between the pair of vertical capacitor plates encoding an on/off state of the antifuse, an antifuse voltage being determined in part by a cross-sectional shape of the metal columns.

9. The antifuse of claim 8 wherein the metal columns are round cylinders.

10. The antifuse of claim 8 wherein the metal columns are square cylinders arranged in a diamond pattern.

11. A method of making a microelectronic circuit element, the method comprising:
    forming a dielectric block;
    patterning the dielectric block with an array of openings;
    patterning the dielectric block with links to connect selected ones of the array of openings to form a geometrical shape;

filling the patterned array of openings and the links with metal; and
planarizing the array of openings,
wherein the patterning the dielectric block with links forms a pair of substantially parallel planes and the microelectronic circuit element is a capacitor suitable for use as a microelectronic anti-fuse.

\* \* \* \* \*